(12) United States Patent
Chen et al.

(10) Patent No.: US 12,074,119 B2
(45) Date of Patent: Aug. 27, 2024

(54) CHIP PACKAGE STRUCTURE

(71) Applicant: Taiwan Semiconductor Manufacturing Company, Ltd., Hsinchu (TW)

(72) Inventors: Jiun-Ting Chen, Hsinchu (TW); Ying-Ching Shih, Hsinchu (TW); Szu-Wei Lu, Hsinchu (TW); Chih-Wei Wu, Zhuangwei Township, Yilan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/319,610

(22) Filed: May 18, 2023

(65) Prior Publication Data

US 2023/0307381 A1    Sep. 28, 2023

Related U.S. Application Data

(60) Continuation of application No. 17/392,868, filed on Aug. 3, 2021, now Pat. No. 11,694,975, which is a division of application No. 16/395,385, filed on Apr. 26, 2019, now Pat. No. 11,088,086.

(51) Int. Cl.
| | |
|---|---|
| *H01L 23/00* | (2006.01) |
| *H01L 21/56* | (2006.01) |
| *H01L 23/31* | (2006.01) |
| *H01L 25/00* | (2006.01) |
| *H01L 25/065* | (2023.01) |

(52) U.S. Cl.
CPC .......... *H01L 23/562* (2013.01); *H01L 21/563* (2013.01); *H01L 23/3157* (2013.01); *H01L 24/17* (2013.01); *H01L 24/32* (2013.01); *H01L 24/73* (2013.01); *H01L 24/81* (2013.01); *H01L 24/83* (2013.01); *H01L 25/0655* (2013.01); *H01L 25/50* (2013.01); *H01L 2224/73253* (2013.01); *H01L 2924/3511* (2013.01)

(58) Field of Classification Search
CPC .............. H01L 23/562; H01L 23/3157; H01L 21/563; H01L 24/17; H01L 24/32; H01L 24/73; H01L 24/81; H01L 24/83; H01L 25/0655; H01L 25/50
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |

(Continued)

*Primary Examiner* — Nathan W Ha
(74) *Attorney, Agent, or Firm* — McClure, Qualey & Rodack, LLP

(57) ABSTRACT

A chip package structure is provided. The chip package structure includes a substrate. The chip package structure also includes a first chip structure and a second chip structure over the substrate. The chip package structure further includes an anti-warpage bar between the first chip structure and the second chip structure. In addition, the chip package structure includes an underfill layer between the first chip structure and the second chip structure and between the anti-warpage bar and the substrate. A topmost surface of the underfill layer is lower than a top surface of the anti-warpage bar.

20 Claims, 23 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,461,018 B1 | 10/2016 | Tsai et al. |
| 9,478,504 B1* | 10/2016 | Shen ................ H01L 23/49838 |
| 9,496,189 B2 | 11/2016 | Yu et al. |
| 9,620,430 B2* | 4/2017 | Lu ........................ H01L 21/563 |
| 9,666,502 B2 | 5/2017 | Chen et al. |
| 9,735,131 B2 | 8/2017 | Su et al. |
| 10,978,409 B2* | 4/2021 | Cho ....................... H01L 23/562 |
| 11,404,346 B2* | 8/2022 | Kim .................... H01L 21/4871 |
| 2004/0124515 A1* | 7/2004 | Tao ......................... H01L 24/97 438/126 |
| 2013/0187258 A1* | 7/2013 | Lu ..................... H01L 23/3135 257/621 |
| 2015/0001701 A1* | 1/2015 | Li ............................ H05K 5/03 257/713 |
| 2015/0262972 A1* | 9/2015 | Katkar .................... H01L 22/32 438/107 |
| 2016/0181218 A1* | 6/2016 | Karhade ............. H01L 25/0657 257/737 |
| 2016/0300782 A1* | 10/2016 | Chen ...................... H01L 24/20 |
| 2017/0287871 A1* | 10/2017 | Lu ......................... H01L 21/568 |
| 2017/0352612 A1* | 12/2017 | Sung ................. H01L 23/49811 |
| 2017/0372979 A1* | 12/2017 | Gandhi .............. H01L 23/3675 |
| 2018/0061747 A1* | 3/2018 | Tang ..................... H01L 23/562 |
| 2018/0138101 A1* | 5/2018 | Yu ......................... H01L 23/481 |
| 2018/0166396 A1* | 6/2018 | Lee ........................ H01L 21/56 |
| 2018/0190596 A1* | 7/2018 | Chang .................. H01L 23/562 |
| 2019/0206807 A1* | 7/2019 | Cho .................... H01L 25/0655 |
| 2019/0237412 A1* | 8/2019 | Lee ....................... H01L 23/367 |
| 2020/0105771 A1* | 4/2020 | Morris .................... H01L 23/16 |
| 2020/0161275 A1* | 5/2020 | Lin ...................... H01L 23/5384 |
| 2021/0225782 A1* | 7/2021 | Cho .................... H01L 23/3675 |

* cited by examiner

CHIP PACKAGE STRUCTURE

CROSS REFERENCE TO RELATED APPLICATIONS

This application is a Continuation Application of U.S. patent application Ser. No. 17/392,868, filed Aug. 3, 2021, and entitled "CHIP PACKAGE STRUCTURE", which is a Division of pending U.S. application Ser. No. 16/395,385, filed Apr. 26, 2019 and entitled "CHIP PACKAGE STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The dies of the wafer may be processed and packaged at the wafer level, and various technologies have been developed for wafer level packaging. Since the chip package structure may need to include different chips with different functions, it is a challenge to form a reliable chip package structure with different chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the chip package structure of FIG. 1A, in accordance with some embodiments.

FIG. 1B-1 is a top view of the chip package structure of FIG. 1B, in accordance with some embodiments.

FIG. 1C-1 is a top view of the chip package structure of FIG. 1C, in accordance with some embodiments.

FIG. 1I-1 is a top view of the chip package structure of FIG. 1I, in accordance with some embodiments.

DETAILED DESCRIPTION

Figure 1A:
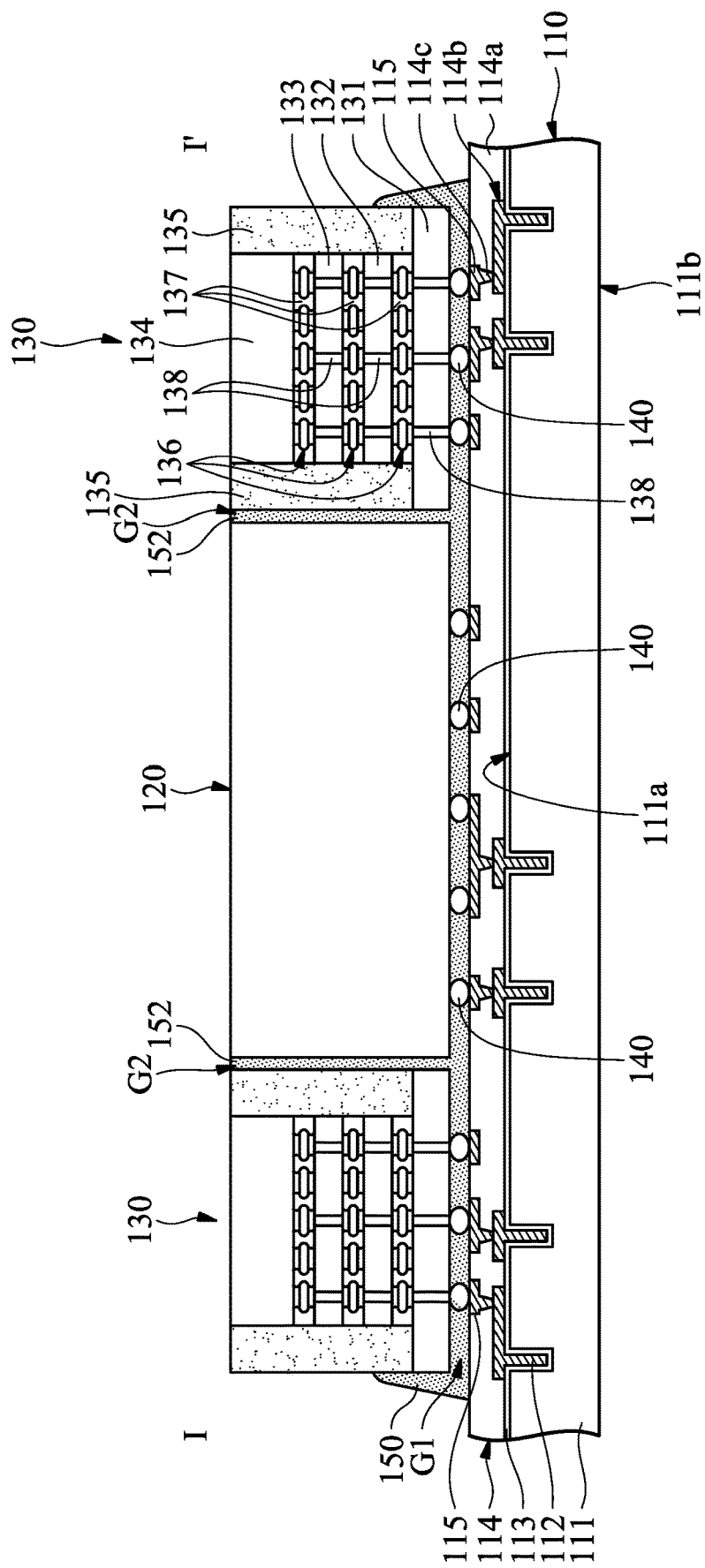
FIGS. 1A-1I are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figures 1, 1A:
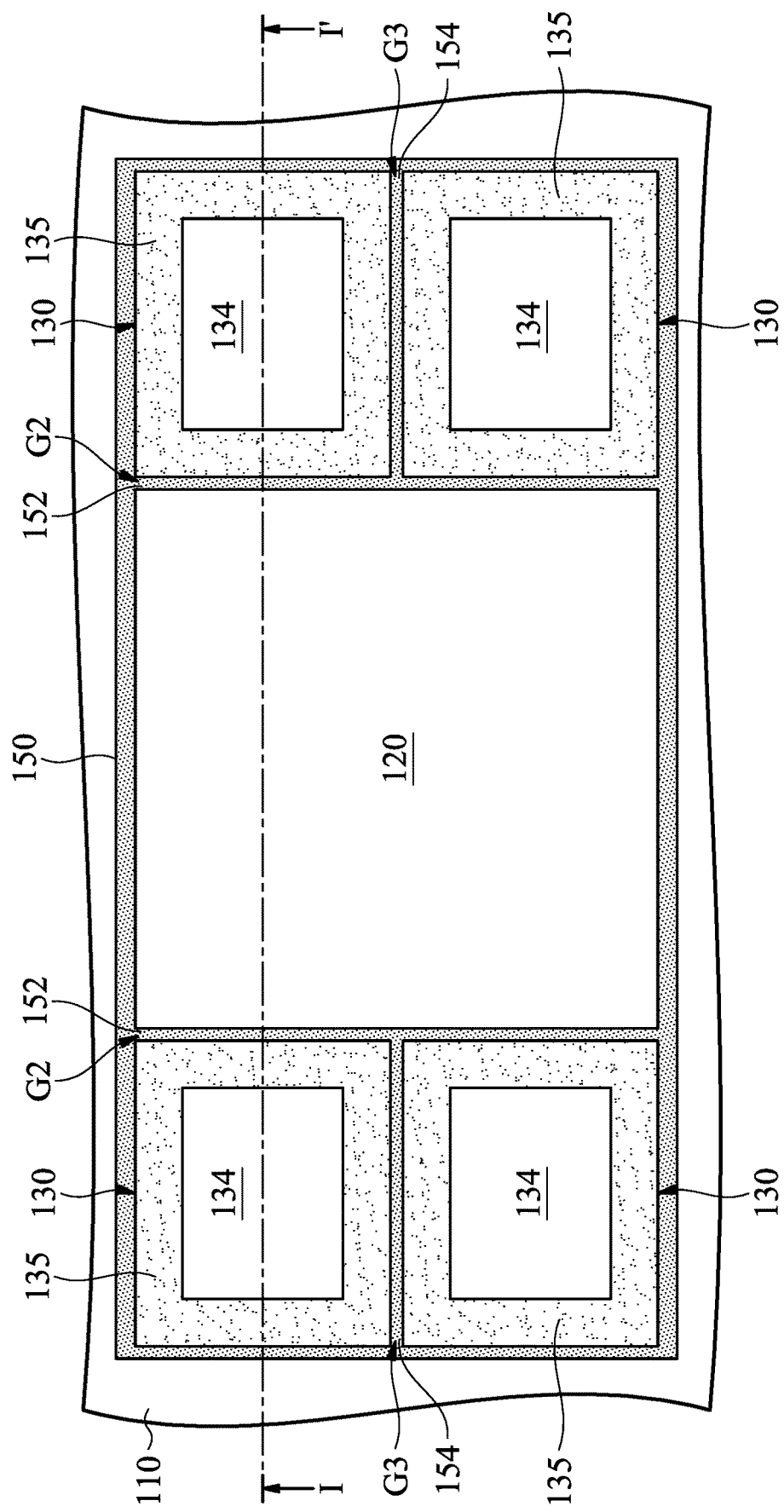

FIGS. 1A-1I are cross-sectional views of various stages of a process for forming a chip package structure, in accordance with some embodiments. FIG. 1A-1 is a top view of the chip package structure of FIG. 1A, in accordance with some embodiments. FIG. 1A is a cross-sectional view illustrating the chip package structure along a sectional line I-I' in FIG. 1A-1, in accordance with some embodiments.

As shown in FIGS. 1A and 1A-1, a substrate 110 is provided, in accordance with some embodiments. In some embodiments, the substrate 110 is a wafer. The substrate 110 includes a semiconductor structure 111, conductive vias 112, an insulating layer 113, a redistribution structure 114, and conductive pads 115, in accordance with some embodiments.

The semiconductor structure 111 has surfaces 111a and 111b, in accordance with some embodiments. In some embodiments, the semiconductor structure 111 is made of an elementary semiconductor material including silicon or germanium in a single crystal, polycrystal, or amorphous structure.

In some other embodiments, the semiconductor structure 111 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 111 may also include multi-layer semiconductors, semiconductor on insulator (SOI) (such as silicon on insulator or germanium on insulator), or a combination thereof.

In some embodiments, the substrate 110 is an interposer wafer. The conductive vias 112 are formed in the semiconductor structure 111, in accordance with some embodiments. The conductive vias 112 may be formed to extend from the surface 111a into the semiconductor structure 111. The insulating layer 113 is formed over the semiconductor structure 111, in accordance with some embodiments. The insulating layer 113 is between the conductive vias 112 and the semiconductor structure 111, in accordance with some embodiments.

The insulating layer 113 is configured to electrically insulate the conductive vias 112 from the semiconductor structure 111, in accordance with some embodiments. The insulating layer 113 is made of an oxide-containing material such as silicon oxide, in accordance with some embodiments. The insulating layer 113 is formed using an oxidation process, a deposition process, or another suitable process.

In some other embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at the surface 111a. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

The redistribution structure 114 is formed over the semiconductor structure 111, in accordance with some embodiments. The conductive pads 115 are formed over the redistribution structure 114, in accordance with some embodiments. The redistribution structure 114 includes a dielectric layer 114a, wiring layers 114b, and conductive vias 114c, in accordance with some embodiments. The dielectric layer 114a is formed over the surface 111a, in accordance with some embodiments. The wiring layers 114b are formed in the dielectric layer 114a, in accordance with some embodiments.

As shown in FIG. 1A, the conductive vias 114c are electrically connected between different wiring layers 114b and between the wiring layer 114b and the conductive pads 115, in accordance with some embodiments. For the sake of simplicity, FIG. 1A only shows one of the wiring layers 114b, in accordance with some embodiments. The conductive vias 112 are electrically connected to the conductive pads 115 through the wiring layers 114b and the conductive vias 114c, in accordance with some embodiments.

As shown in FIG. 1A, the chip structures 120 and 130 are bonded to the substrate 110 through the conductive bumps 140 between the chip structure 120 and the substrate 110 and between the chip structures 130 and the substrate 110, in accordance with some embodiments. The chip structures 120 and 130 are spaced apart from the substrate 110, in accordance with some embodiments. There are gaps G1 between the chip structure 120 and the substrate 110 and between the chip structures 130 and the substrate 110, in accordance with some embodiments. The conductive bumps 140 are in the gaps G1, in accordance with some embodiments.

The chip structures 120 and 130 are spaced apart from each other by gaps G2, in accordance with some embodiments. The chip structure 120 includes a chip, such as a system on chip (SoC), in accordance with some embodiments. In some other embodiments, the chip structure 120 includes a chip package structure.

In some embodiments, the chip structure 130 includes multiple semiconductor dies. As shown in FIG. 1A, the chip structure 130 includes semiconductor dies 131, 132, 133, and 134, in accordance with some embodiments. In some embodiments, the chip structure 130 includes a molding layer 135 that encapsulates and protects the semiconductor dies 132, 133 and 134. The molding layer 135 may include an epoxy-based resin with fillers dispersed therein. The fillers may include insulating fibers, insulating particles, other suitable elements, or a combination thereof.

In some embodiments, the semiconductor dies 132, 133 and 134 are memory dies. The memory dies may include memory devices such as static random access memory (SRAM) devices, dynamic random access memory (DRAM) devices, other suitable devices, or a combination thereof. In some embodiments, the semiconductor die 131 is a control die that is electrically connected to the memory dies (e.g., the semiconductor dies 132, 133 and 134) stacked thereon. The chip structure 130 may function as a high bandwidth memory (HBM).

Many variations and/or modifications can be made to embodiments of the disclosure. In some embodiments, the chip structure 130 includes a single semiconductor chip. The semiconductor chip may be a system on chip. In some embodiments, conductive bonding structures 136 are formed between the semiconductor dies 131, 132, 133 and 134 to bond them together, as shown in FIG. 1A. In some embodiments, each of the conductive bonding structures 136 includes metal pillars and/or solder bumps.

In some embodiments, underfill layers 137 are formed between the semiconductor dies 131, 132, 133 and 134 to surround and protect the conductive bonding structures 136. In some embodiments, the underfill layer 137 includes an epoxy-based resin with fillers dispersed therein. The fillers may include insulating fibers, insulating particles, other suitable elements, or a combination thereof.

In some embodiments, multiple conductive vias 138 are formed in the semiconductor dies 131, 132, and 133, as shown in FIG. 1A. Each conductive via 138 penetrates through one of the semiconductor dies 131, 132, and 133 and is electrically connected to the conductive bonding structures 136 thereunder and/or thereover. Electrical signals can be transmitted between these vertically stacked semiconductor dies 131, 132, 133 and 134 through the conductive vias 138.

As shown in FIGS. 1A and 1A-1, an underfill layer 150 is formed into the gaps G1 between the substrate 110 and each of the chip structures 120 and 130, in accordance with some embodiments. As shown in FIGS. 1A and 1A-1, the gaps G2 between the chip structures 120 and 130 are filled with a portion 152 of the underfill layer 150, in accordance with some embodiments. As shown in FIG. 1A-1, gaps G3 between the chip structures 130 are filled with a portion 154 of the underfill layer 150, in accordance with some embodiments.

Figure 1B:
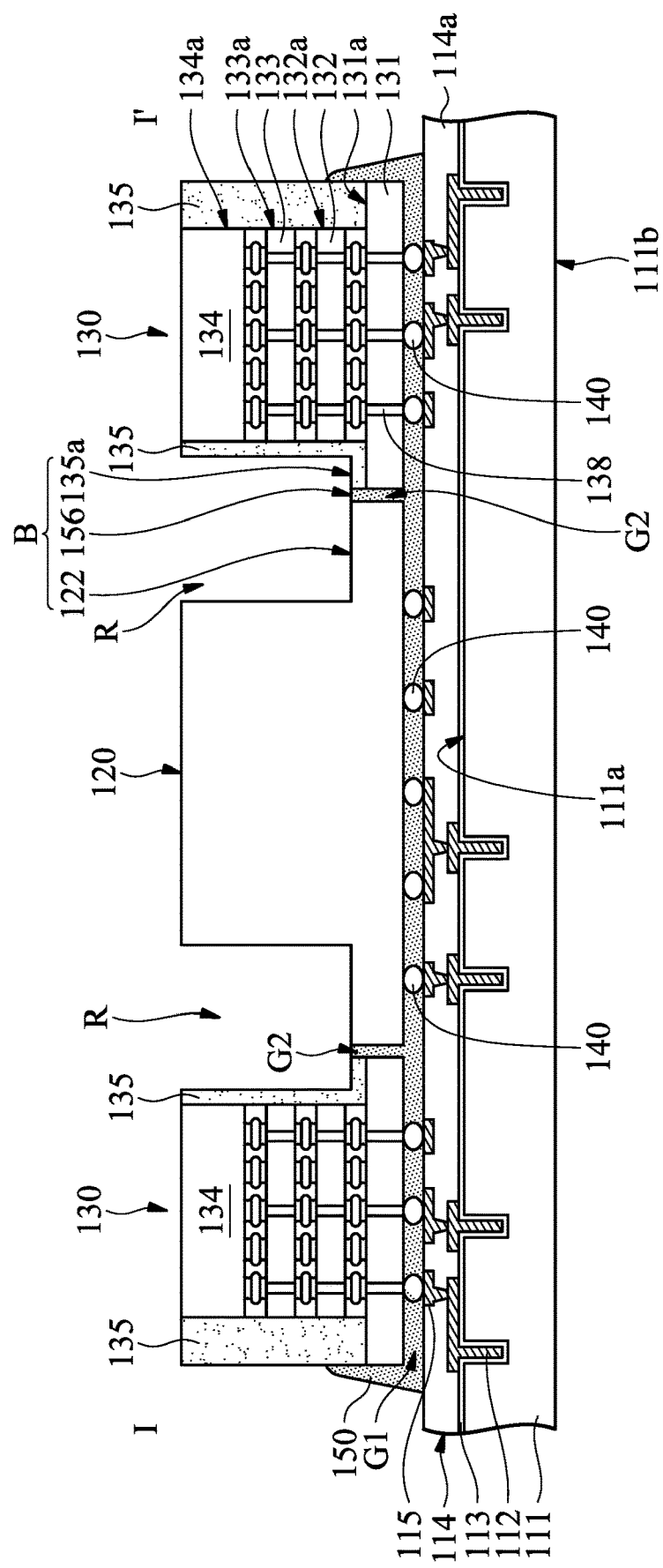
Figures 1, 1B:
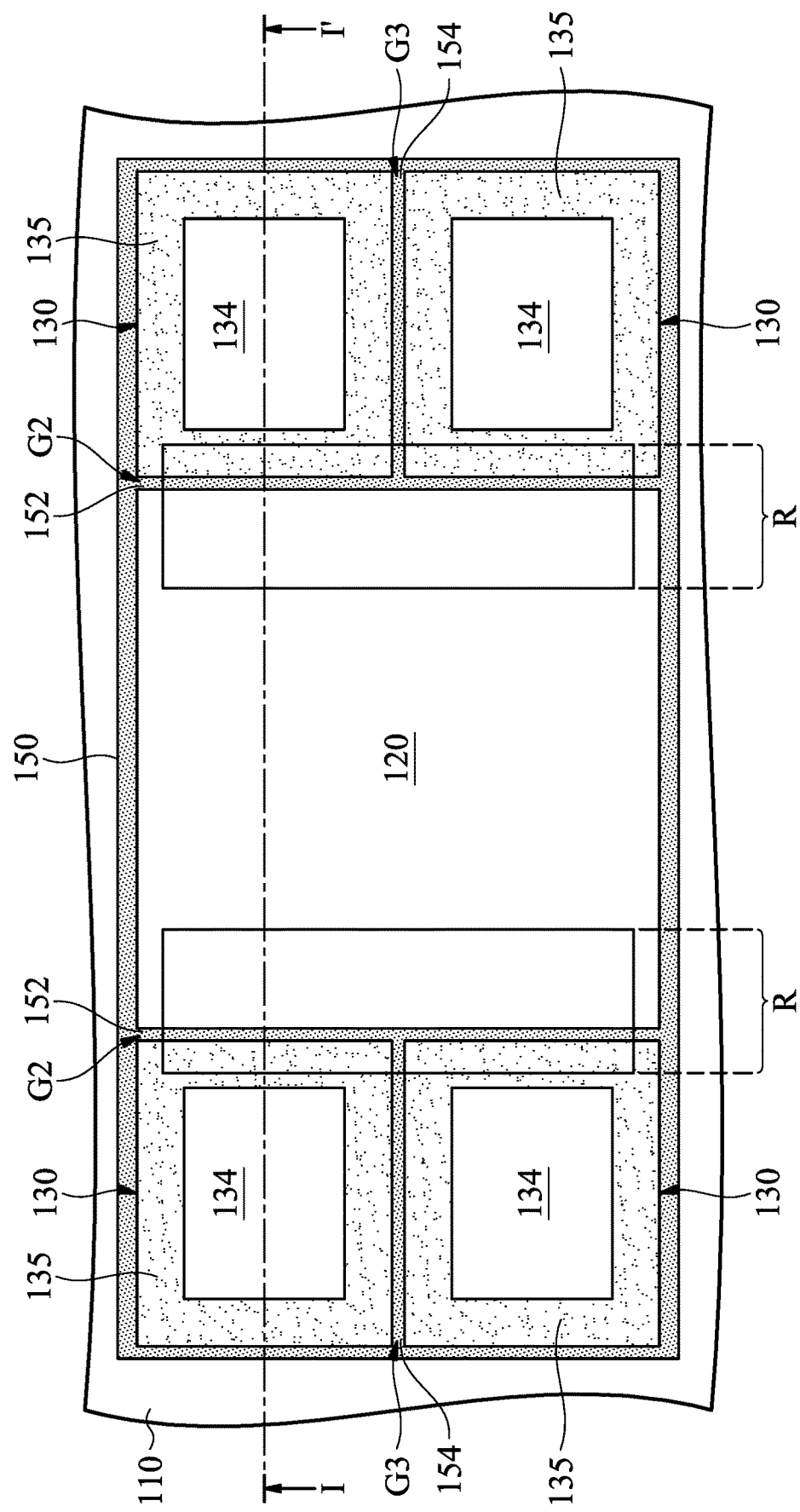

The underfill layer 150 surrounds the chip structures 120 and 130, in accordance with some embodiments. The underfill layer 150 is referred to as a protective layer, in accordance with some embodiments. The underfill layer 150 includes a polymer material, in accordance with some embodiments FIG. 1B-1 is a top view of the chip package structure of FIG. 1B, in accordance with some embodiments. FIG. 1B is a cross-sectional view illustrating the chip package structure along a sectional line I-I' in FIG. 1B-1, in accordance with some embodiments. As shown in FIGS. 1B and 1B-1, portions of the chip structures 120 and 130 and the underfill layer 150 are removed, in accordance with some embodiments. The removal process partially removes the molding layers 135 of the chip structures 130 and the portions 152 and 154 of the underfill layer 150, in accordance with some embodiments.

After the removal process, in each chip structure 130, the remaining molding layer 135 covers the entire sidewalls 132a, 133a and 134a of the semiconductor dies 132, 133 and 134, in accordance with some embodiments. After the removal process, in each chip structure 130, the entire top surface 131a of the semiconductor die 131 is covered by the remaining molding layer 135 and the semiconductor die 132, in accordance with some embodiments.

The removal process forms trenches R partially in the chip structures 120 and 130 and the underfill layer 150, in accordance with some embodiments. The trenches R do not pass through the chip structures 120 and 130 and the underfill layer 150, in accordance with some embodiments. The trenches R are partially over the gaps G2 and G3, in accordance with some embodiments. That is, the trenches R partially overlap the gaps G2 and G3, in accordance with some embodiments.

As shown in FIG. 1B, a lower surface 122 of the chip structure 120, a lower surface 135a of the chip structure 130, and a lower surface 156 of the underfill layer 150 together form a bottom surface B of the trench R, in accordance with some embodiments. The lower surfaces 122, 135a, and 156 are substantially coplanar, in accordance with some embodiments. The term "substantially coplanar" in the application may include small deviations from coplanar geometries. The deviations may be due to manufacturing processes.

Figure 1C:
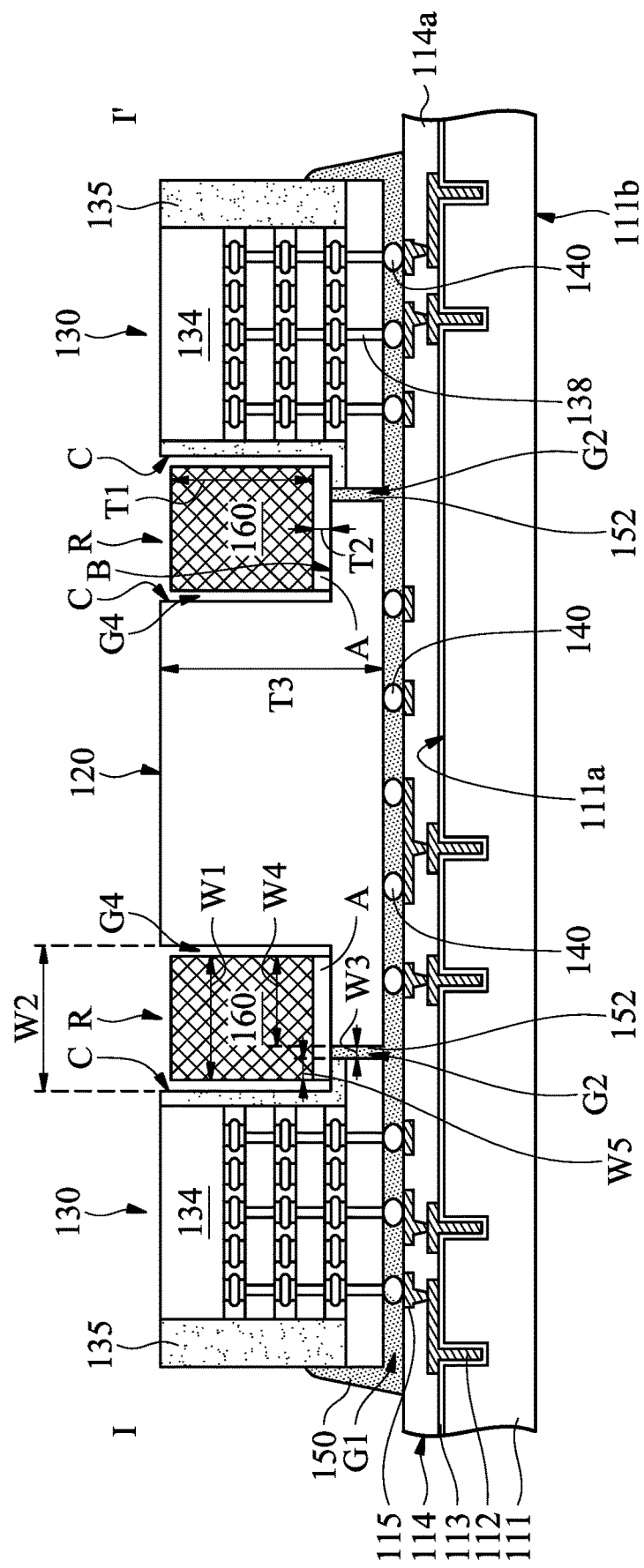
Figures 1, 1C:
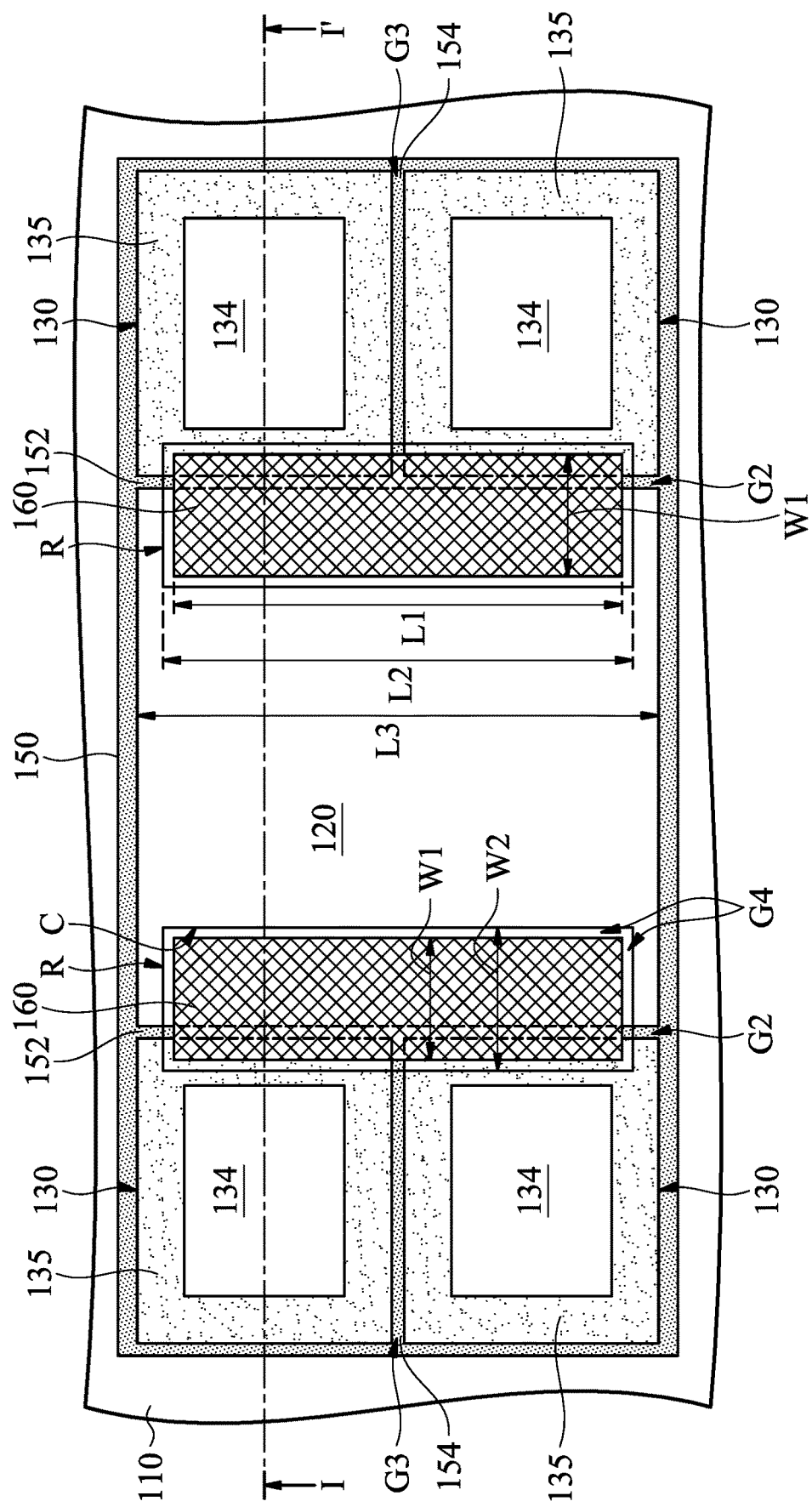

FIG. 1C-1 is a top view of the chip package structure of FIG. 1C, in accordance with some embodiments. FIG. 1C is a cross-sectional view illustrating the chip package structure along a sectional line I-I' in FIG. 1C-1, in accordance with some embodiments. As shown in FIGS. 1C and 1C-1, anti-warpage bars 160 are respectively formed in the trenches R, in accordance with some embodiments.

The anti-warpage bar 160 is over the chip structures 120 and 130 and the portions 152 and 154 of the underfill layer 150, in accordance with some embodiments. The anti-warpage bar 160 is over the bottom surface B, in accordance with some embodiments. The anti-warpage bar 160 extends across the gaps G2 and G3, in accordance with some embodiments. The anti-warpage bar 160 continuously extends from the chip structure 120 into the chip structure 130, in accordance with some embodiments.

The anti-warpage bar 160 is spaced apart from the chip structures 120 and 130 and the underfill layer 150, in accordance with some embodiments. In some embodiments, a width W1 of the anti-warpage bar 160 is less than a width W2 of the trench R, in accordance with some embodiments. The width W2 ranges from about 1 μm to about 10 mm, in accordance with some embodiments.

The anti-warpage bar 160 is spaced apart from inner walls C of the trench R by a gap G4, in accordance with some embodiments. The width W1 of the anti-warpage bar 160 is less than a length L1 of the anti-warpage bar 160, in accordance with some embodiments. The length L1 is less than a length L2 of the trench R, in accordance with some embodiments. The length L2 is less than a length L3 of the chip structure 120, in accordance with some embodiments.

The gap G2 has a width W3, in accordance with some embodiments. The width W2 of the trench R is greater than the width W3, in accordance with some embodiments. The anti-warpage bar 160 over the chip structure 120 has a width W4, in accordance with some embodiments.

The anti-warpage bar 160 over the chip structure 130 has a width W5, in accordance with some embodiments. The width W4 is greater than the width W3, in accordance with some embodiments. In some embodiments, a ratio of the width W4 to the width W3 ranges from about 2 to about 10. The width W3 ranges from about 0.5 μm to about 70 μm, in accordance with some embodiments.

The width W4 ranges from about 100 μm to about 2000 μm, in accordance with some embodiments. The width W5 is greater than the width W3, in accordance with some embodiments. The width W5 ranges from about 100 μm to about 2000 μm, in accordance with some embodiments. In some embodiments, the width W4 is greater than the width W5.

The anti-warpage bars 160 are harder than the underfill layer 150, in accordance with some embodiments. That is, the anti-warpage bars 160 are made of a material harder than the material of the underfill layer 150, in accordance with some embodiments. For example, the anti-warpage bars 160 are made of a metal material or a semiconductor material.

The metal material includes copper, gold, silver, aluminum, an alloy thereof, a combination thereof, or another suitable material, in accordance with some embodiments. If the anti-warpage bars 160 are made of a metal material, the anti-warpage bars 160 improves the heat dissipation efficiency of the chip structures 120 and 130, in accordance with some embodiments.

The semiconductor material includes an elementary semiconductor material including silicon or germanium in a single crystal, polycrystal, or amorphous structure. In some other embodiments, the anti-warpage bars 160 are made of a compound semiconductor (e.g., silicon carbide, gallium arsenide, gallium phosphide, indium phosphide, or indium arsenide), an alloy semiconductor (e.g., SiGe or GaAsP), or a combination thereof. The anti-warpage bars 160 may also include multi-layer semiconductors, semiconductor on insulator (SOI) (such as silicon on insulator or germanium on insulator), or a combination thereof.

As shown in FIG. 1C, each anti-warpage bar 160 is bonded to the chip structures 120 and 130 and the underfill layer 150 through an adhesive layer A thereunder, in accordance with some embodiments. The adhesive layer A is between the anti-warpage bar 160 and the chip structure 120, between the anti-warpage bar 160 and the chip structure 130, and between the anti-warpage bar 160 and the underfill layer 150, in accordance with some embodiments. In some embodiments, a thickness T1 of the anti-warpage bar 160 is greater than a thickness T2 of the adhesive layer A. In some embodiments, a thickness T3 of the chip structure 120 is greater than the thicknesses T1 and T2.

The adhesive layer A is in direct contact with the anti-warpage bar 160 thereover, the chip structures 120 and 130 thereunder, and the underfill layer 150 thereunder, in accordance with some embodiments. The adhesive layer A is made of an insulating material, a polymer material, or metal, in accordance with some embodiments.

Figure 1D:
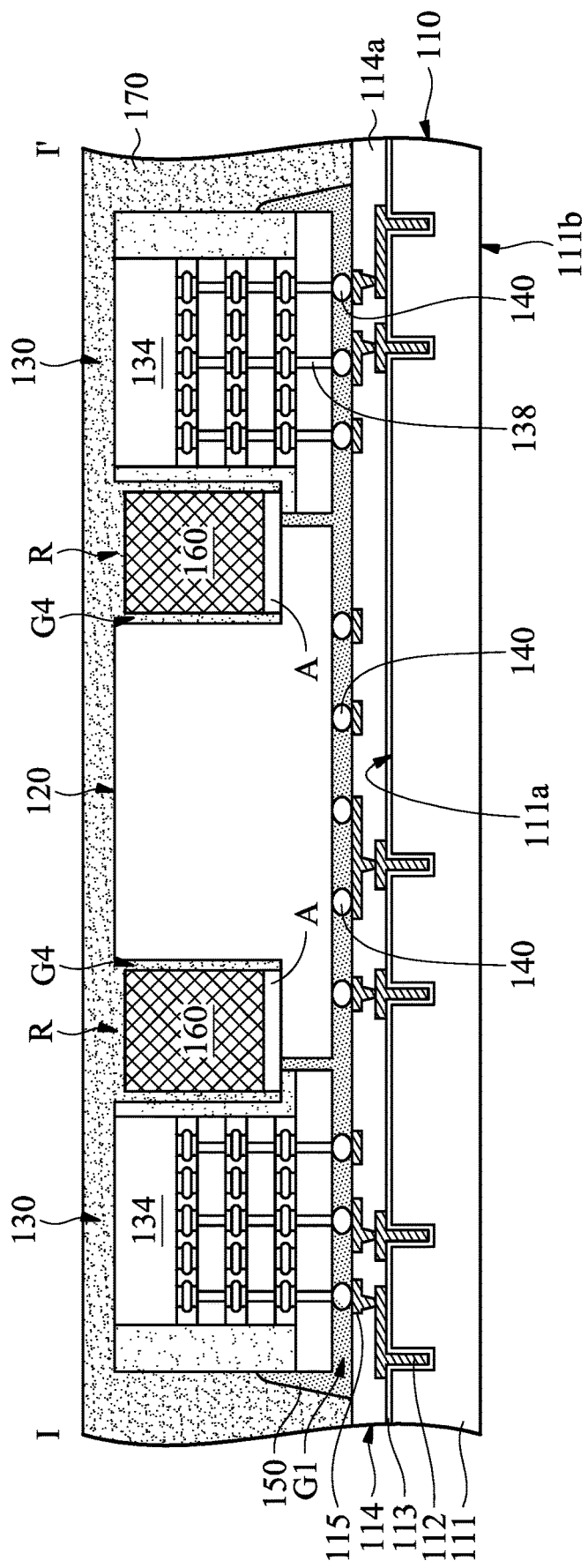

As shown in FIG. 1D, a molding layer 170 is formed over the substrate 110, the chip structures 120 and 130, the conductive bumps 140, the underfill layer 150, the anti-warpage bars 160, and the adhesive layers A, in accordance with some embodiments. The gaps G4 are filled with the molding layer 170, in accordance with some embodiments. The anti-warpage bar 160 is harder than the molding layer 170, in accordance with some embodiments. The molding layer 170 includes a polymer material, in accordance with some embodiments.

Figure 1E:
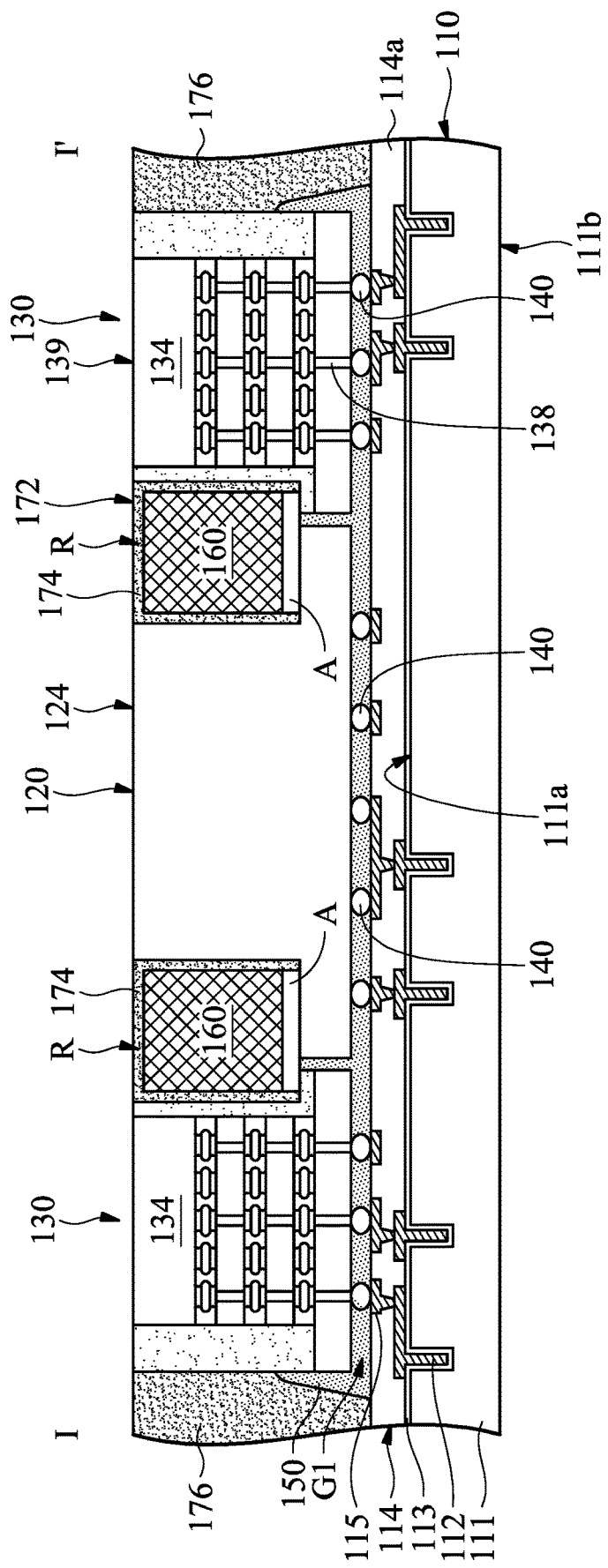

As shown in FIG. 1E, the molding layer 170 is thinned until top surfaces 124 and 139 of the chip structures 120 and 130 are exposed, in accordance with some embodiments. The thinning process includes a chemical mechanical polishing (CMP) process, in accordance with some embodiments. After the thinning process, the top surfaces 124, 139, and 172 of the chip structures 120 and 130 and the molding layer 170 are substantially coplanar, in accordance with some embodiments.

After the thinning process, a portion 174 of the molding layer 170 remains in the trenches R, in accordance with some embodiments. In the trench R, the portion 174 surrounds (or wraps around) the anti-warpage bar 160 and the adhesive layer A, in accordance with some embodiments. In the trench R, the portion 174 covers the entire anti-warpage bar 160 and the entire adhesive layer A, in accordance with some embodiments. After the thinning process, a portion 176 of the molding layer 170 remains over the substrate 110 and outside of the trenches R, in accordance with some embodiments.

The portion 176 surrounds the chip structures 120 and 130, the conductive bumps 140, the underfill layer 150, the anti-warpage bars 160, and the adhesive layers A, in accordance with some embodiments. The portions 174 and 176 are spaced apart from each other, in accordance with some embodiments.

Figure 1F:
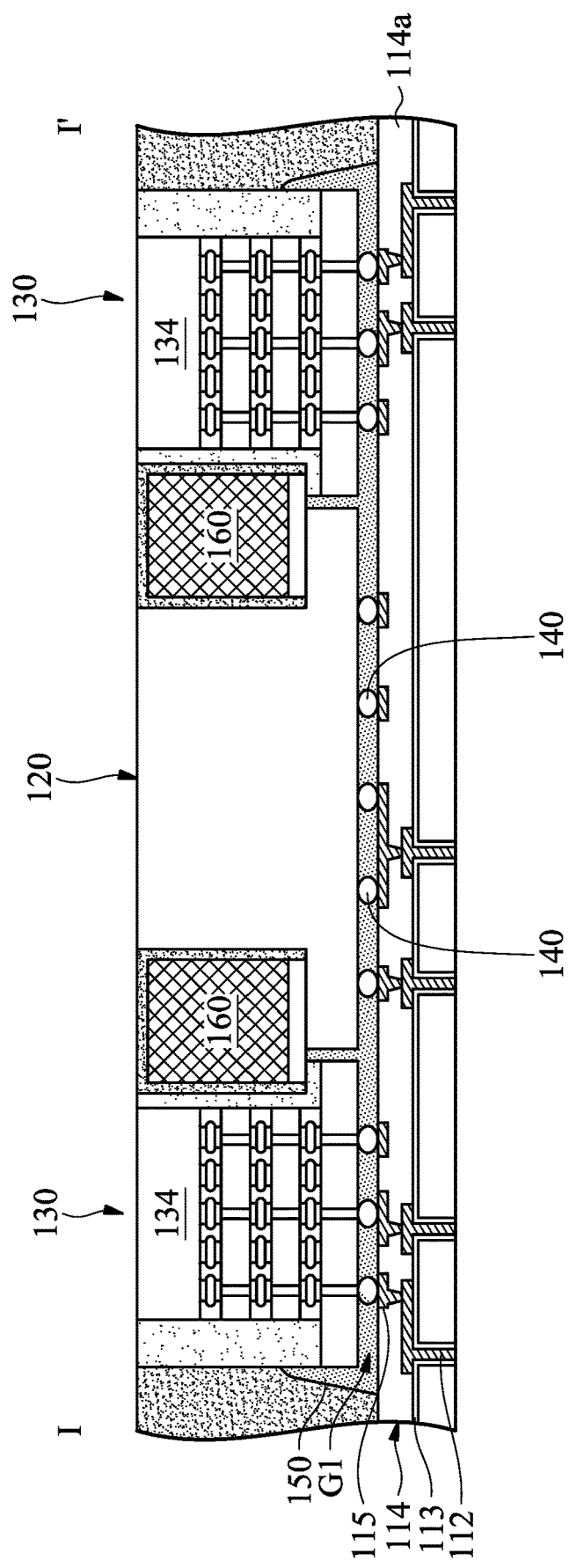

As shown in FIG. 1F, a lower portion of the semiconductor structure 111 is removed, in accordance with some embodiments. The removal process includes a chemical mechanical polishing (CMP) process, in accordance with some embodiments. After the removal process, the conductive vias 112 and the insulating layer 113 are exposed, in accordance with some embodiments.

The conductive vias 112 and the insulating layer 113 pass through the semiconductor structure 111, in accordance with some embodiments. The conductive vias 112 are also referred to as through-substrate vias or through-silicon vias when the semiconductor structure 111 is a silicon substrate, in accordance with some embodiments.

Figure 1G:
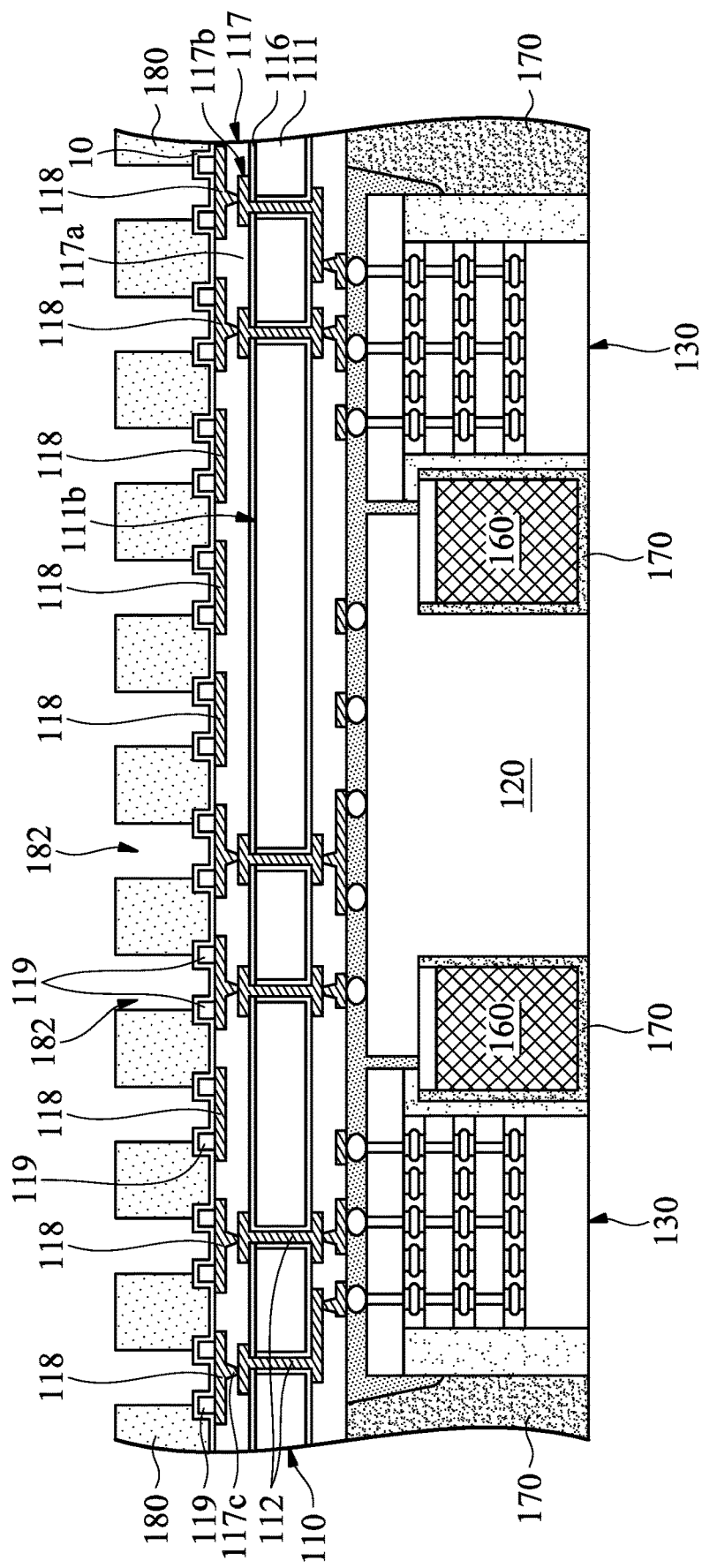

As shown in FIG. 1G, the semiconductor structure 111 is flipped upside down, in accordance with some embodiments. As shown in FIG. 1G, an insulating layer 116 is formed over the surface 111b, in accordance with some embodiments. The insulating layer 116 is configured to electrically insulate wiring layers subsequently formed thereon from the semiconductor structure 111, in accordance with some embodiments. The insulating layer 116 is made of an oxide-containing material such as silicon oxide, in accordance with some embodiments. The insulating layer 116 is formed using an oxidation process, a deposition process, or another suitable process.

In some embodiments, a redistribution structure 117 is formed over the surface 111b of the semiconductor structure 111, in accordance with some embodiments. The redistribution structure 117 includes a dielectric layer 117a, wiring layers 117b, and conductive vias 117c, in accordance with some embodiments. The wiring layers 117b are formed in the dielectric layer 117a, in accordance with some embodiments.

As shown in FIG. 1G, conductive pads 118 are formed over the redistribution structure 117, in accordance with some embodiments. The conductive vias 117c are electrically connected between different wiring layers 117b and between the wiring layer 117b and the conductive pads 118, in accordance with some embodiments. For the sake of simplicity, FIG. 1G only shows one of the wiring layers 117b, in accordance with some embodiments. The conductive vias 112 are electrically connected to the conductive pads 118 through the wiring layers 117b and the conductive vias 117c, in accordance with some embodiments.

As shown in FIG. 1G, buffer rings 119 are formed over the conductive pads 118, in accordance with some embodiments. The buffer ring 119 has an opening 119a exposing the conductive pads 118 thereunder, in accordance with some embodiments. The buffer rings 119 are configured to buffer the stress between bumps subsequently formed thereover and the substrate 110, in accordance with some embodiments.

The buffer rings 119 are made of an elastic material such as a polymer material (e.g., polyimide), in accordance with some embodiments. In some other embodiments (not shown), the buffer rings 119 are replaced with a buffer layer having openings exposing the conductive pads 118.

As shown in FIG. 1G, a seed layer 10 is formed over the redistribution structure 117, the buffer rings 119, and the conductive pads 118, in accordance with some embodiments. The materials of the seed layer 10 may include copper or copper alloys. The materials of the seed layer 10 may include other metals, such as silver, gold, aluminum, and combinations thereof.

As shown in FIG. 1G, a mask layer 180 is formed over the seed layer 10, in accordance with some embodiments. The mask layer 180 has openings 182 exposing the seed layer 10 over the conductive pads 118 and the buffer rings 119 adjacent to the conductive pads 118, in accordance with some embodiments. The mask layer 180 is made of a polymer material such as a photoresist material, in accordance with some embodiments.

Figure 1H:
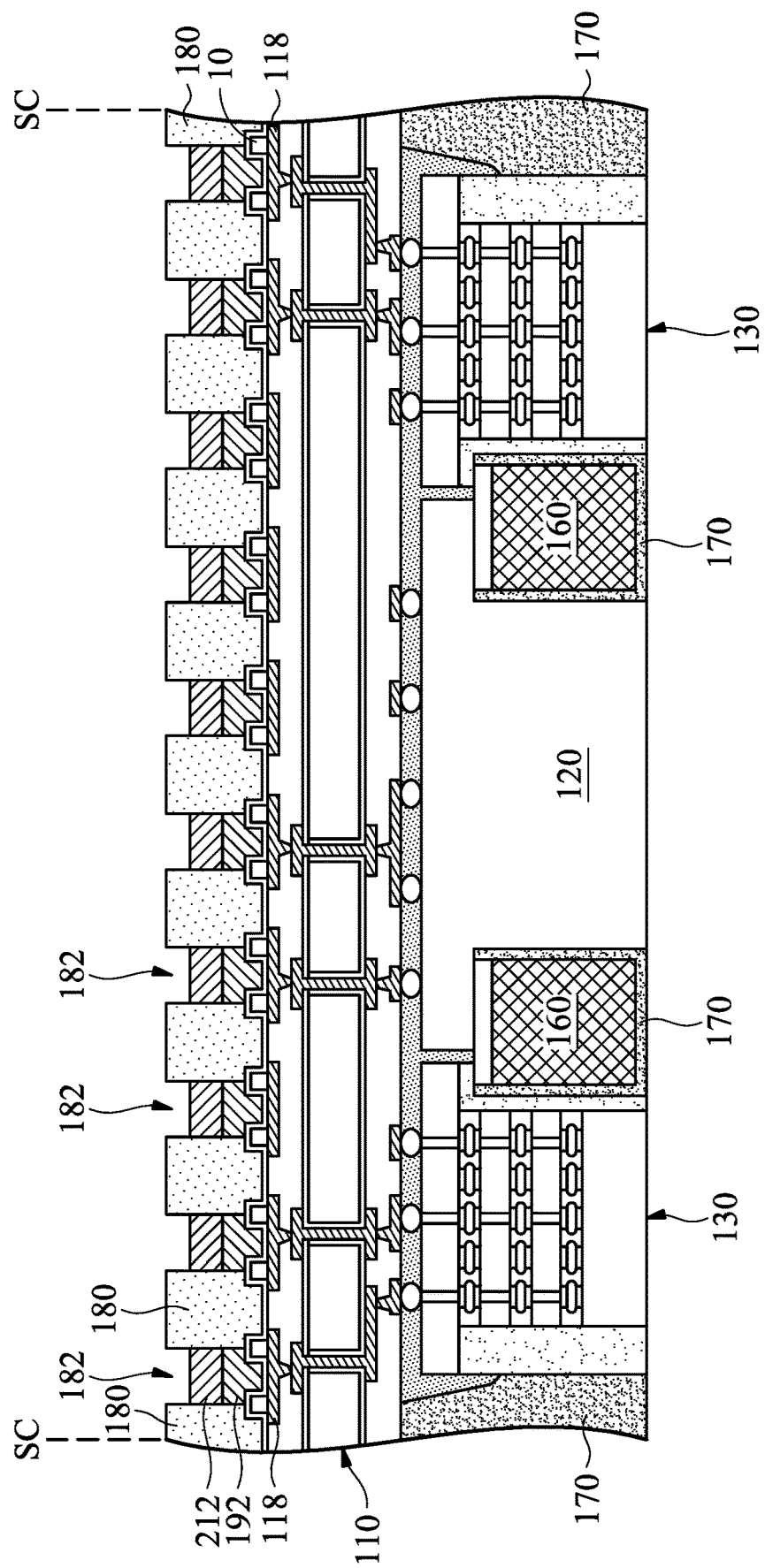

As shown in FIG. 1H, conductive bumps 192 are formed in the openings 182 and over the conductive pads 118, in accordance with some embodiments. In some embodiments, the conductive bumps 192 are electrically connected to the chip structures 120 and/or 130 through the substrate 110. The conductive bumps 192 are made of a conductive material such as copper (Cu), aluminum (Al), tungsten (W), cobalt (Co), or nickel (Ni), in accordance with some embodiments. The conductive bumps 192 are formed using a plating process such as an electroplating process, in accordance with some embodiments.

As shown in FIG. 1H, a solder layer 212 is formed over the conductive bumps 192, in accordance with some embodiments. The solder layer 212 is made of tin (Sn) or another suitable conductive material with a melting point lower than that of the conductive bumps 192, in accordance with some embodiments. The solder layer 212 is formed using a plating process such as an electroplating process, in accordance with some embodiments.

Figure 1I:
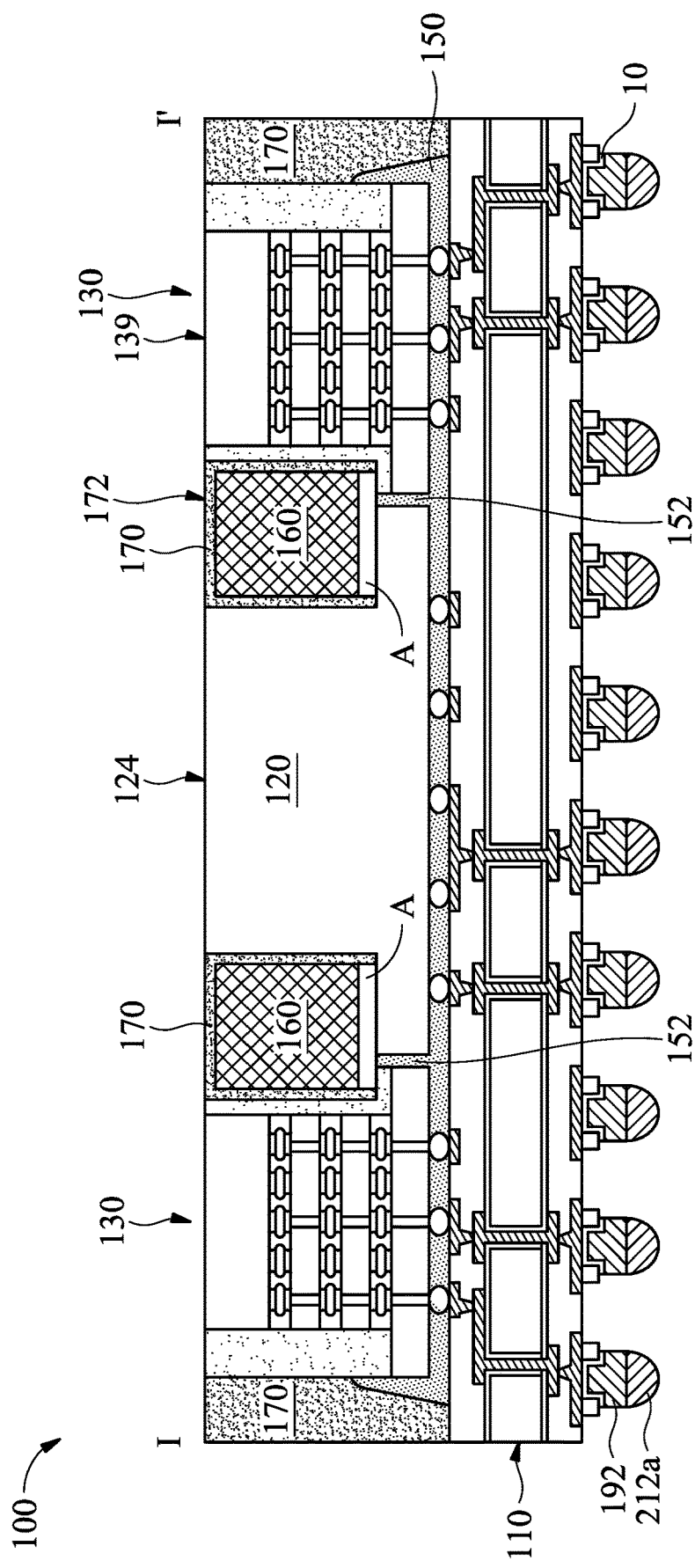
Figures 1, 1I:
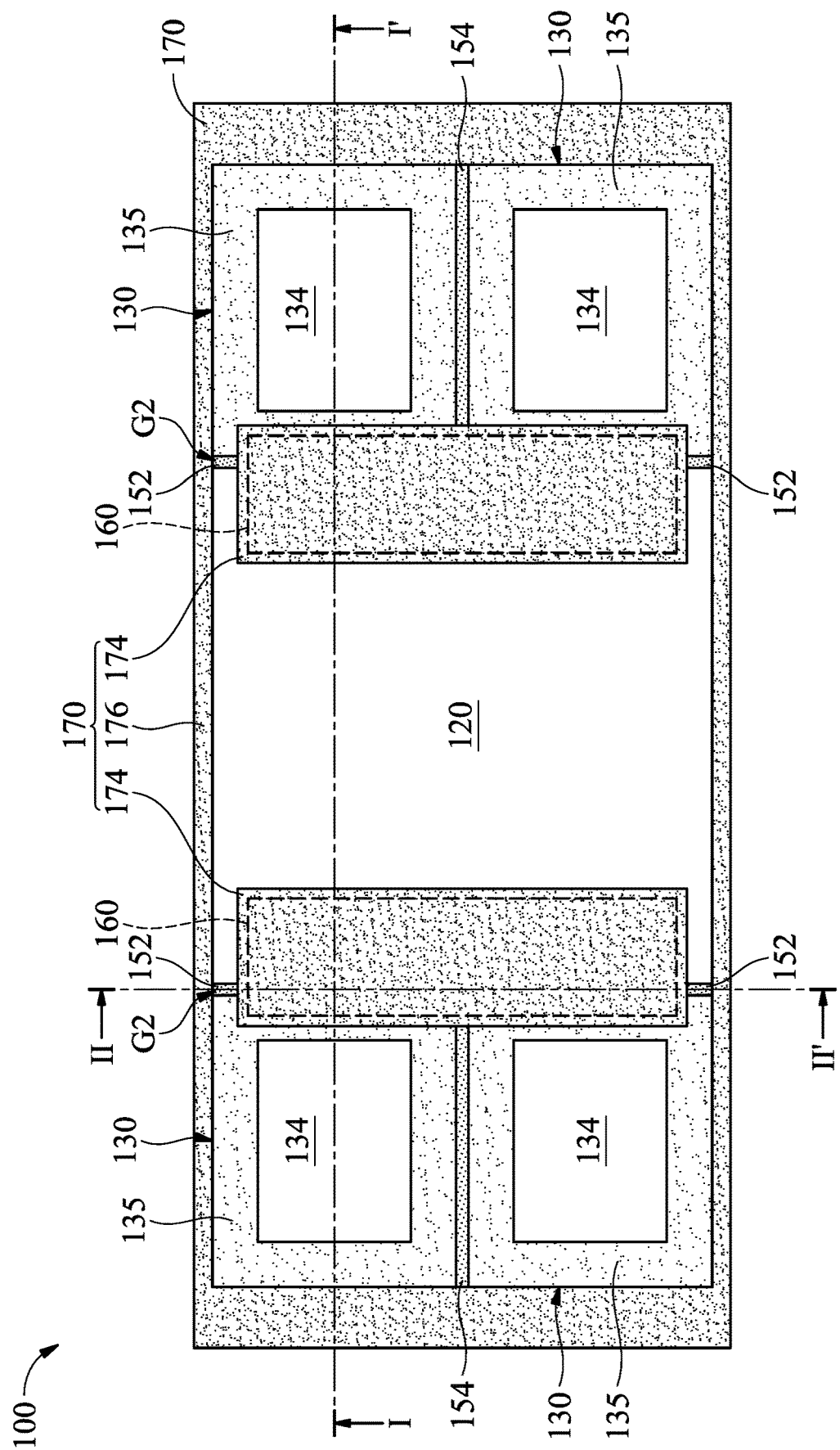

As shown in FIG. 1I, the mask layer 180 is removed, in accordance with some embodiments. As shown in FIG. 1I, the seed layer 10 originally covered by the mask layer 180 is removed, in accordance with some embodiments. The seed layer 10 is removed using an etching process, in accordance with some embodiments. As shown in FIG. 1I, a reflow process is performed over the solder layer 212 to convert the solder layer 212 into solder balls 212a, in accordance with some embodiments.

FIG. 1I-1 is a top view of the chip package structure of FIG. 1I, in accordance with some embodiments. FIG. 1I is a cross-sectional view illustrating the chip package structure along a sectional line I-I' in FIG. 1I-1, in accordance with some embodiments. As shown in FIGS. 1H, 1I, and 1I-1, a cutting process is performed to cut through the substrate 110 and the molding layer 170 along predetermined scribe lines SC to form chip packages 100, in accordance with some embodiments. For the sake of simplicity, FIG. 1I only shows one of the chip packages 100, in accordance with some embodiments.

As shown in FIG. 1I, the chip package 100 is flipped upside down, in accordance with some embodiments. As shown in FIG. 1I-1, the portion 174 of the molding layer 170 is separated from the portion 176 of the molding layer 170 by the portions 152 and 154 of the underfill layer 150 and the chip structures 120 and 130, in accordance with some embodiments.

Since the portion 152 of the underfill layer 150 between the chip structures 120 and 130 is partially replaced by the anti-warpage bars 160 which are harder than the underfill layer 150, the anti-warpage bars 160 reduce the warpage of the chip package 100 resulting from the mismatch of coefficients of thermal expansion (CTE) between the chip structures 120 and 130.

Figure 2A:
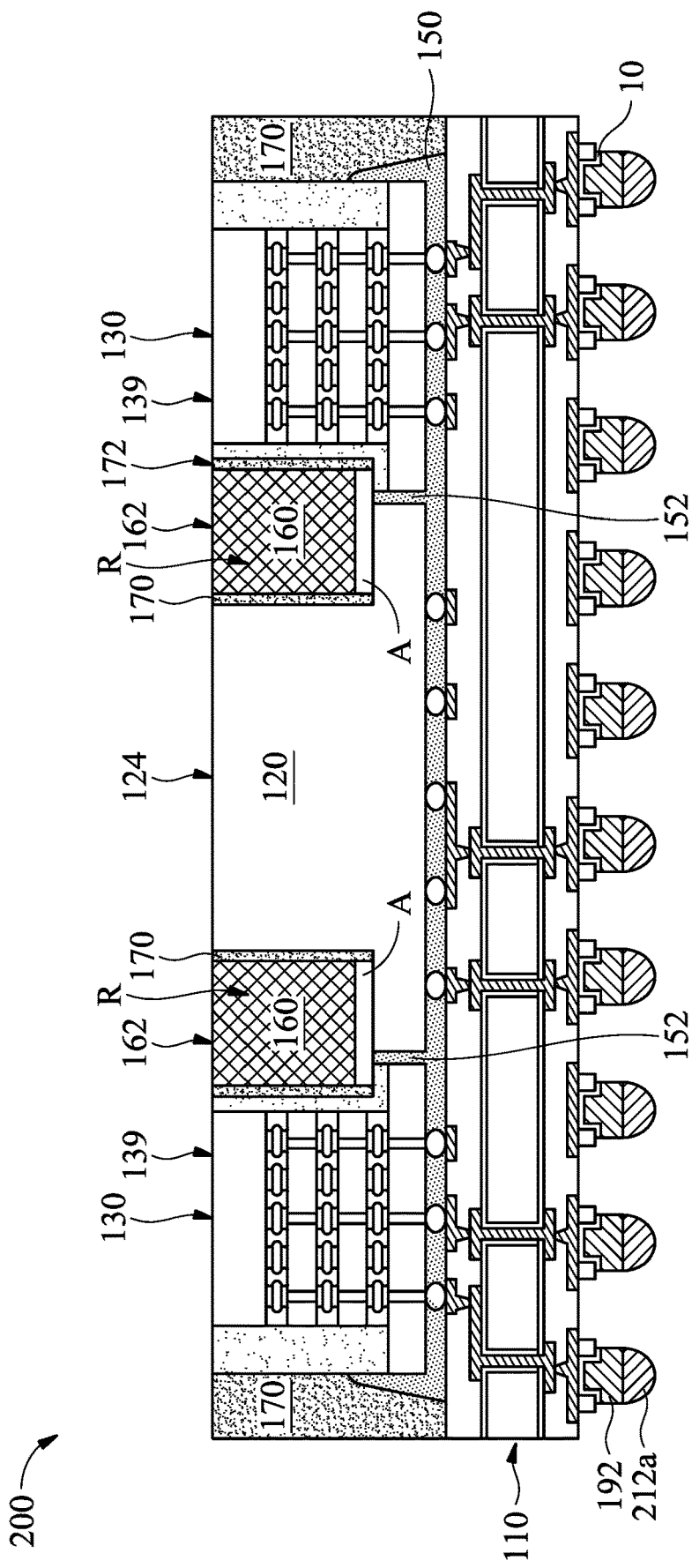
FIG. 2A is a cross-sectional view of a chip package structure, in accordance with some embodiments.
Figure 2B:
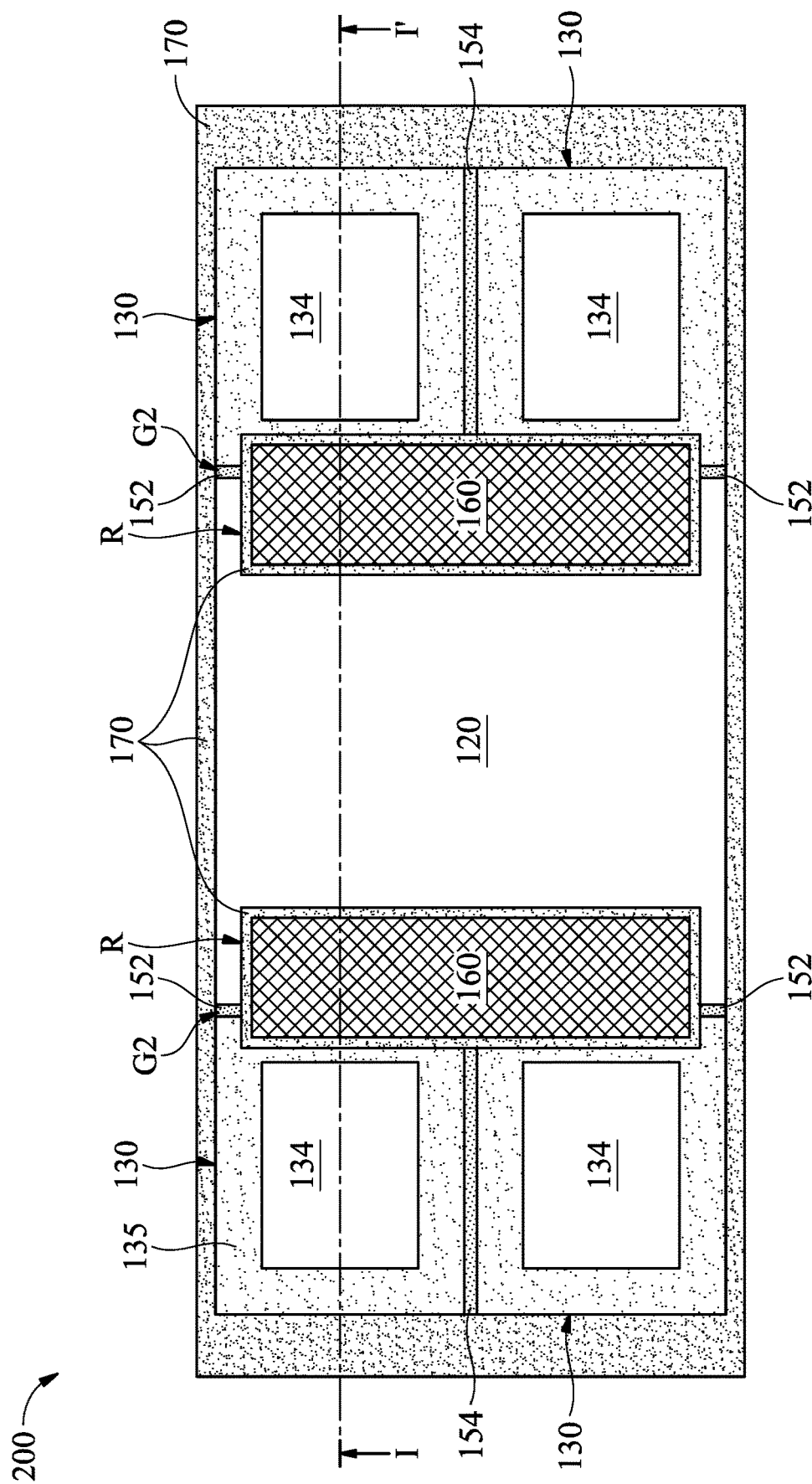
FIG. 2B is a top view of the chip package structure of FIG. 2A, in accordance with some embodiments.

FIG. 2A is a cross-sectional view of a chip package structure 200, in accordance with some embodiments. FIG. 2B is a top view of the chip package structure 200 of FIG. 2A, in accordance with some embodiments. FIG. 2A is a cross-sectional view illustrating the chip package structure 200 along a sectional line I-I' in FIG. 2B, in accordance with some embodiments.

As shown in FIGS. 2A and 2B, the structure and the forming method of the chip package structure 200 is similar to that of the chip package structure 100 of FIG. 1I, except that the formation of the molding layer 170 of the chip package structure 200, in accordance with some embodiments.

The formation of the molding layer 170 of the chip package structure 200 includes: forming the molding layer 170 over the substrate 110, the chip structures 120 and 130, the conductive bumps 140, the underfill layer 150, the anti-warpage bars 160, and the adhesive layers A (as shown in FIG. 1D); and then thinning the molding layer 170 until the top surfaces 124, 139, and 162 of the chip structures 120 and 130 and the anti-warpage bars 160 are exposed (as shown in FIGS. 2A and 2B).

The thinning process includes a chemical mechanical polishing (CMP) process, in accordance with some embodiments. After the thinning process, the molding layer 170 remaining in the trench R surrounds (or wraps around) the anti-warpage bar 160 and the adhesive layer A, in accordance with some embodiments. After the thinning process, the top surfaces 124, 139, 162, and 172 of the chip structures 120 and 130, the anti-warpage bars 160, and the molding layer 170 are substantially coplanar, in accordance with some embodiments.

Figure 3:
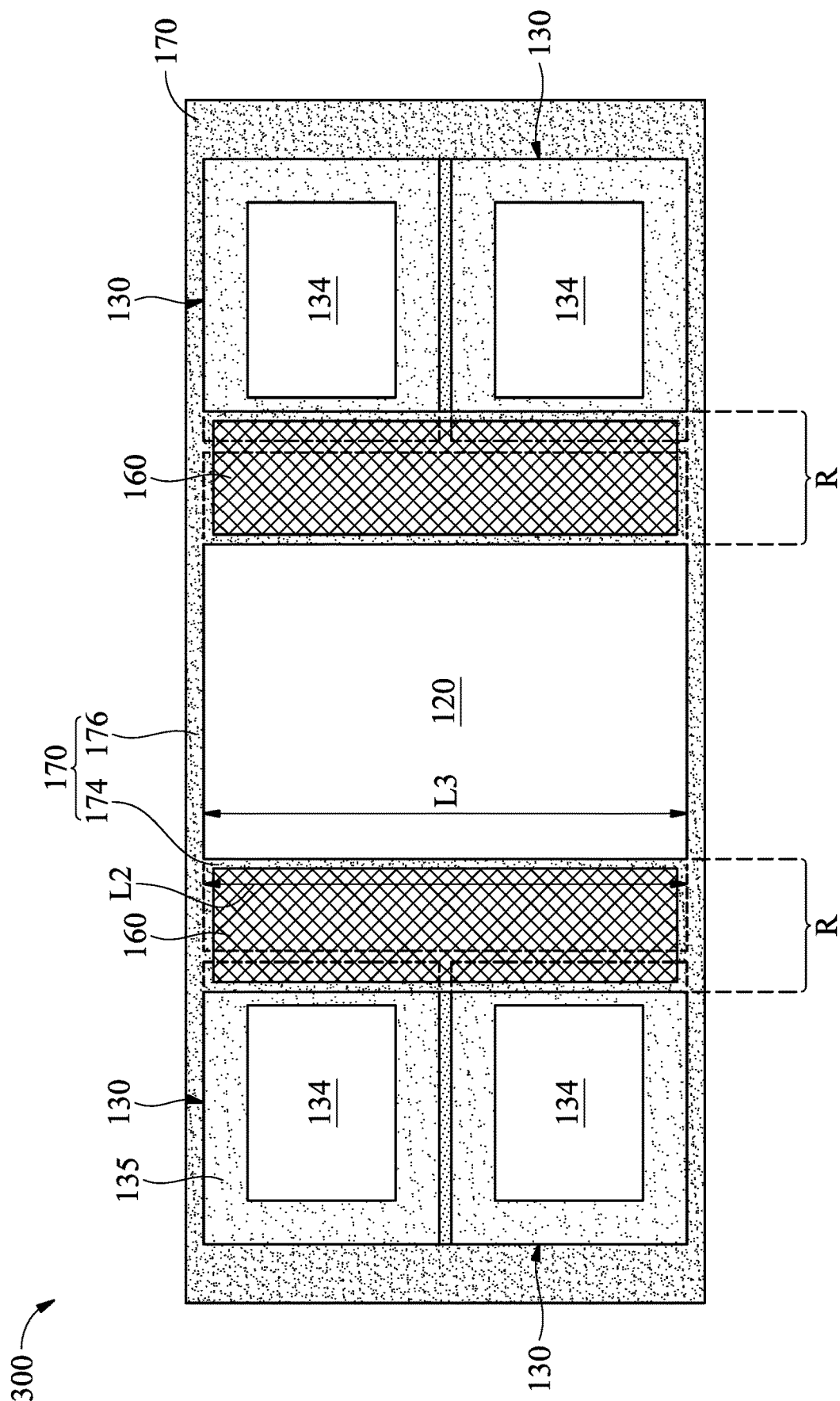
FIG. 3 is a top view of a chip package structure, in accordance with some embodiments.

FIG. 3 is a top view of a chip package structure 300, in accordance with some embodiments. As shown in FIG. 3, the chip package structure 300 is similar to that of the chip package structure 200 of FIGS. 2A and 2B, except that the length L2 of the trench R is substantially equal to the length L3 of the chip structure 120, in accordance with some embodiments. Therefore, the portion 174 of the molding layer 170 in the trenches R is connected to the portion 176 of the molding layer 170 outside of the trenches R, in accordance with some embodiments. The anti-warpage bars 160 have a strip shape, in accordance with some embodiments. The anti-warpage bar 160 has an uniform width, in accordance with some embodiments.

Figure 4A:
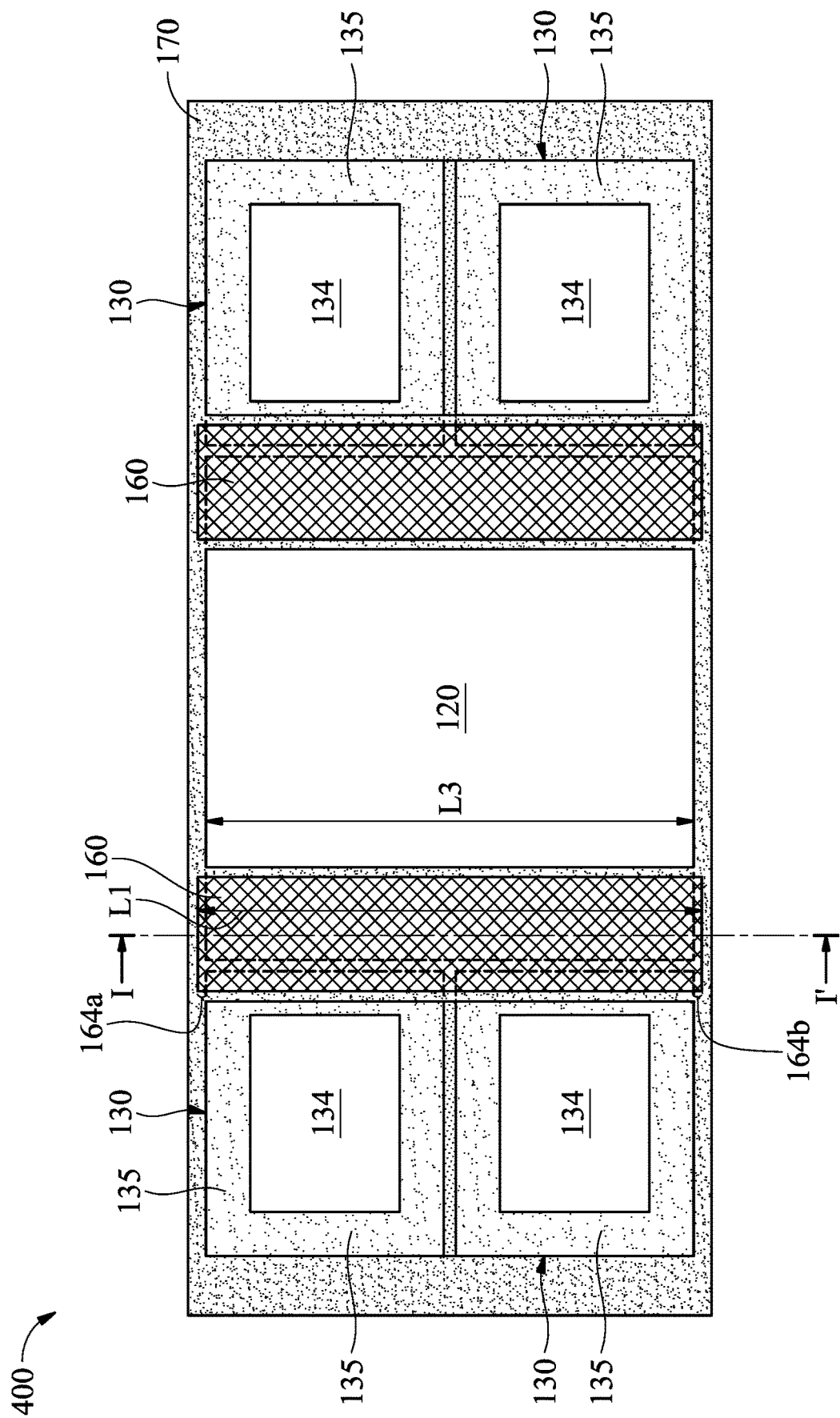
FIG. 4A is a top view of a chip package structure, in accordance with some embodiments.
Figure 4B:
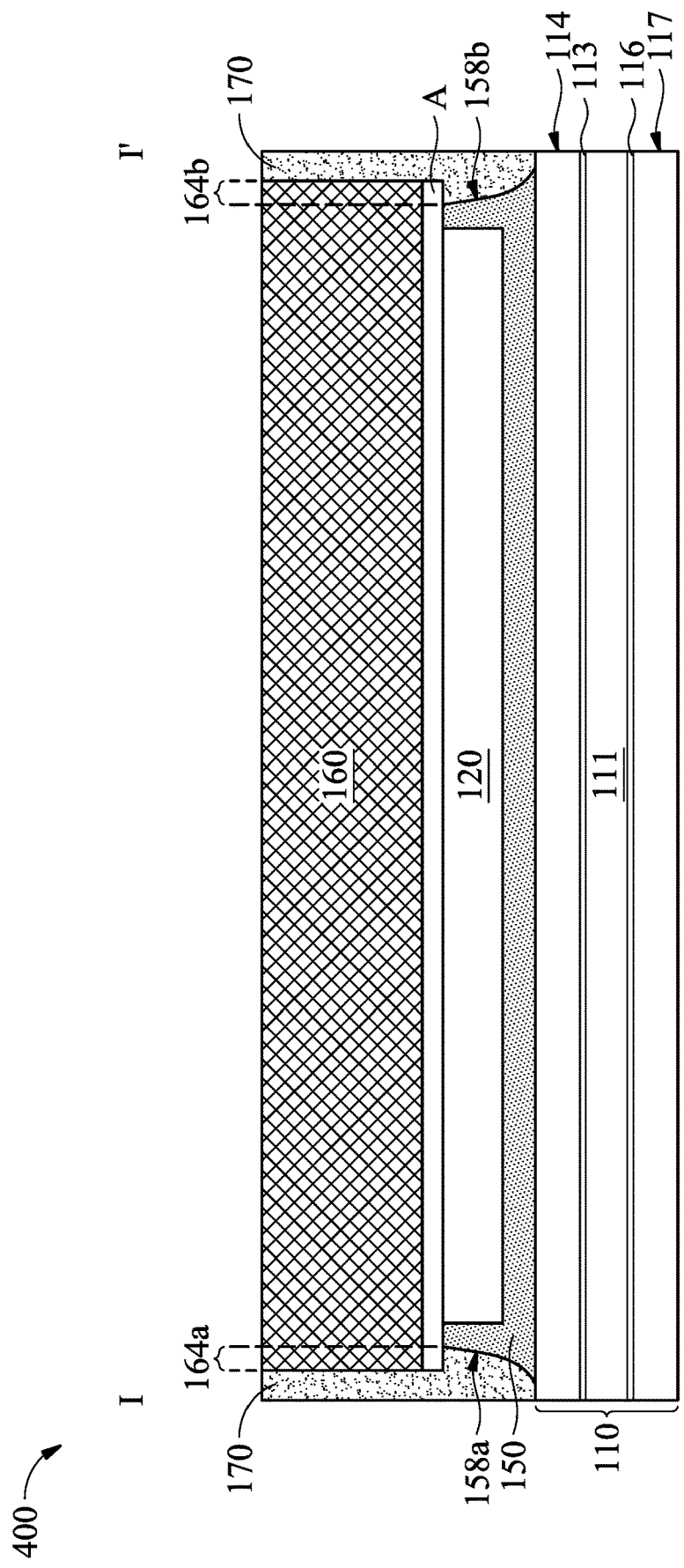
FIG. 4B is a cross-sectional view illustrating the chip package structure along a sectional line I-I' in FIG. 4A, in accordance with some embodiments.

FIG. 4A is a top view of a chip package structure 400, in accordance with some embodiments. FIG. 4B is a cross-sectional view illustrating the chip package structure 400 along a sectional line I-I' in FIG. 4A, in accordance with some embodiments.

As shown in FIGS. 4A and 4B, the chip package structure 400 is similar to that of the chip package structure 300 of FIG. 3, except that the length L1 of the anti-warpage bar 160 is greater than the length L3 of the chip structure 120, in accordance with some embodiments. The end portions 164a and 164b of the anti-warpage bar 160 respectively protrude from sidewalls 158a and 158b of the underfill layer 150, in accordance with some embodiments.

Figure 5:
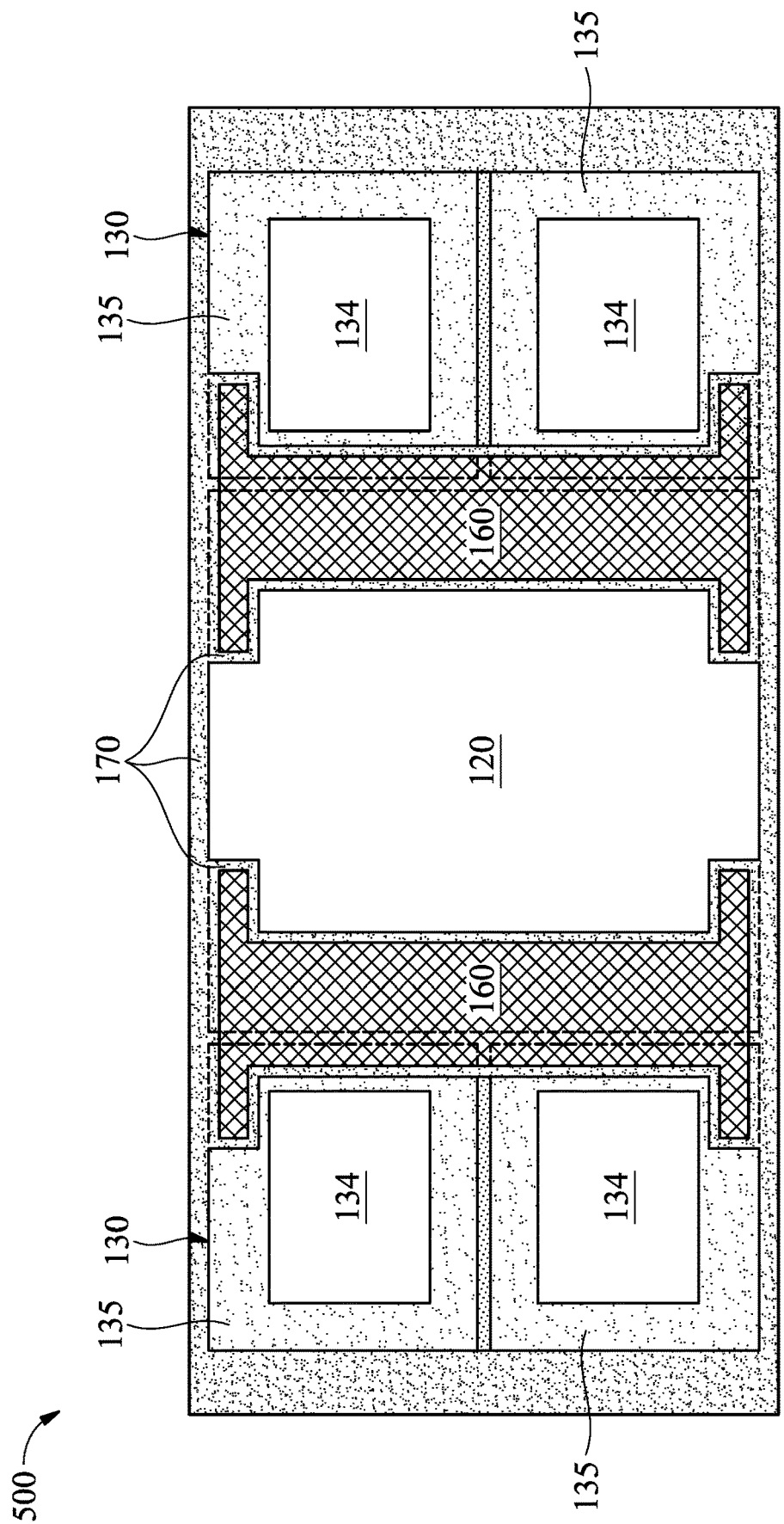
FIG. 5 is a top view of a chip package structure, in accordance with some embodiments.

FIG. 5 is a top view of a chip package structure 500, in accordance with some embodiments. As shown in FIG. 5, the chip package structure 500 is similar to that of the chip package structure 300 of FIG. 3, except that the anti-warpage bars 160 of the chip package structure 500 have an I-shape, which is different from that of the anti-warpage bars 160 of the chip package structure 300, in accordance with some embodiments. The anti-warpage bars 160 of the chip package structure 300 of FIG. 3 have a strip shape, in accordance with some embodiments.

Figure 6:
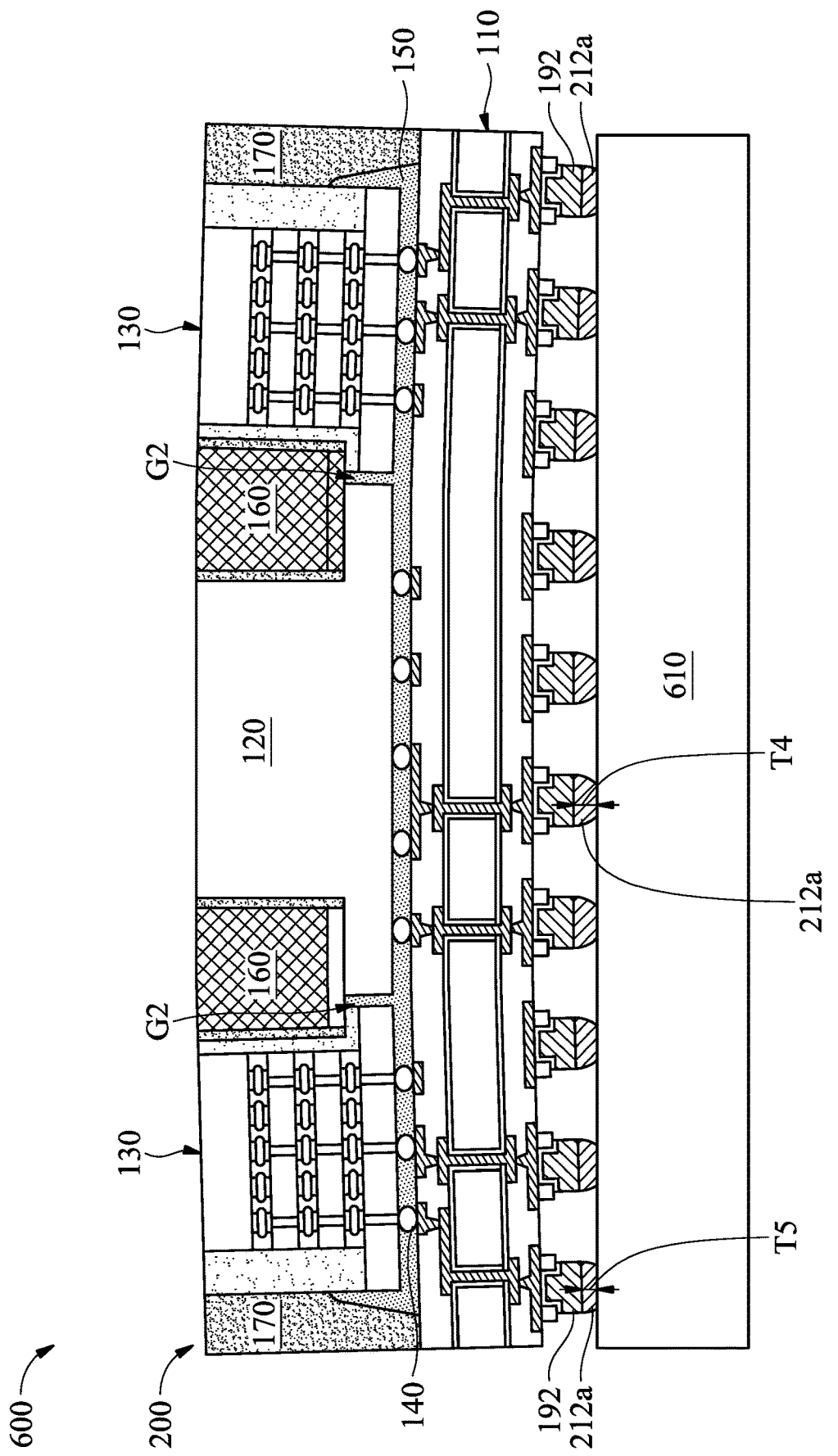
FIG. 6 is a cross-sectional view of a chip package structure, in accordance with some embodiments.

FIG. 6 is a cross-sectional view of a chip package structure 600, in accordance with some embodiments. As shown FIG. 6, the chip package structure 200 of FIG. 2A is bonded to a substrate 610, in accordance with some embodiments. After bonding the chip package structure 200 to the substrate 610, the chip package structure 200 may be slightly warped along the gaps G2 between the chip structures 120 and 130.

The anti-warpage bars 160 and the substrate 110 may be slightly warped, in accordance with some embodiments. The thickness T4 of the solder balls 212a right under the chip structure 120 is greater than the thickness T5 of the solder balls 212a right under the chip structure 130, in accordance with some embodiments.

The substrate 610 may be a wiring substrate or an interposer substrate. In some other embodiments, the chip package structure 200 is replaced by the chip package structure 100 of FIG. 1I, the chip package structure 300 of FIG. 3, the chip package structure 400 of FIG. 4A, the chip package structure 500 of FIG. 5, or the chip package structure 700 of FIG. 7.

Figure 7:
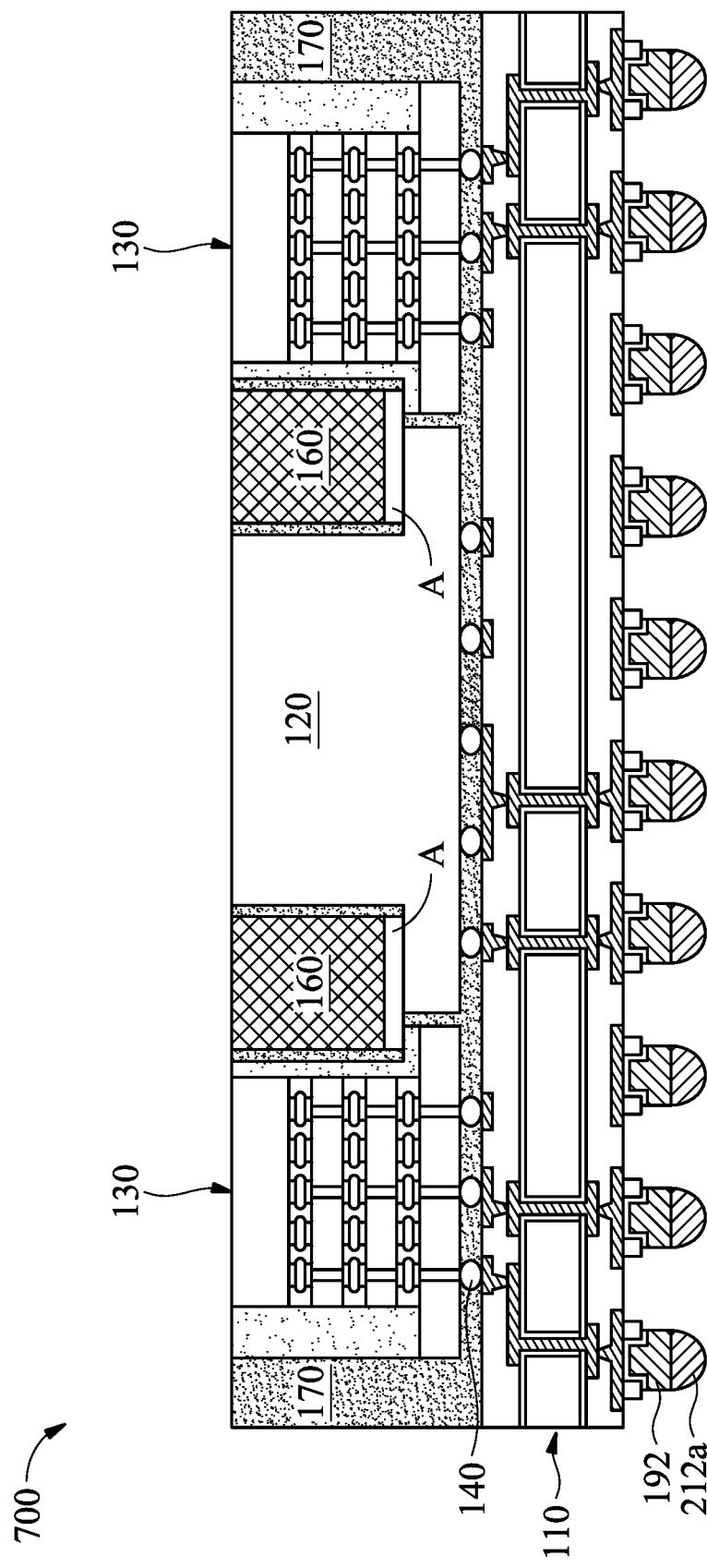
FIG. 7 is a cross-sectional view of a chip package structure, in accordance with some embodiments.

FIG. 7 is a cross-sectional view of a chip package structure 700, in accordance with some embodiments. As shown in FIG. 7, the chip package structure 700 is similar to that of the chip package structure 200 of FIG. 2A, except that the chip package structure 700 does not have the underfill layer 150, in accordance with some embodiments. The molding layer 170 is in direct contact with the substrate 110, the chip structures 120 and 130, the conductive bumps 140, the anti-warpage bars 160, and the adhesive layers A, in accordance with some embodiments.

Figure 8A:
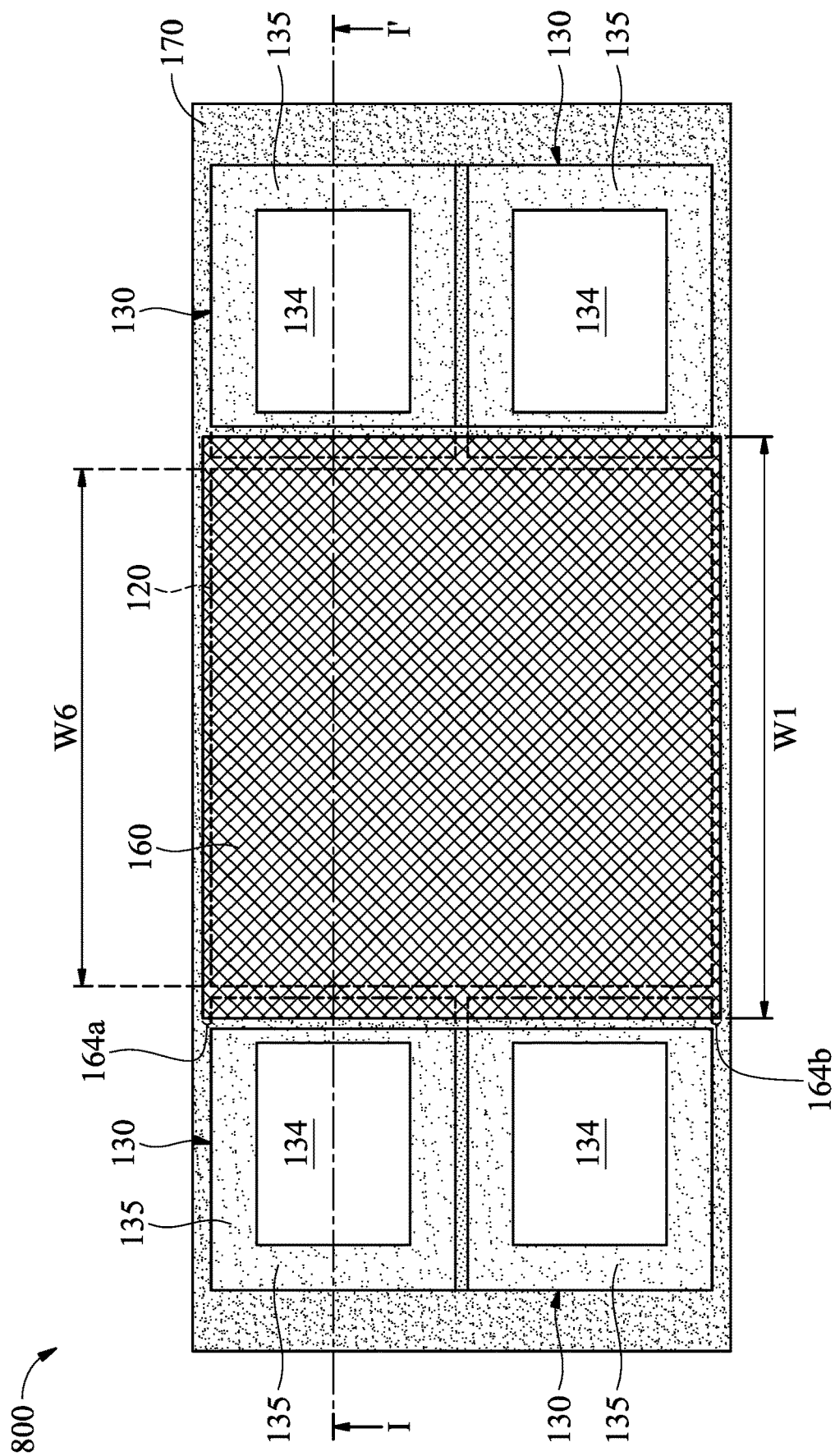
FIG. 8A is a top view of a chip package structure, in accordance with some embodiments.
Figure 8B:
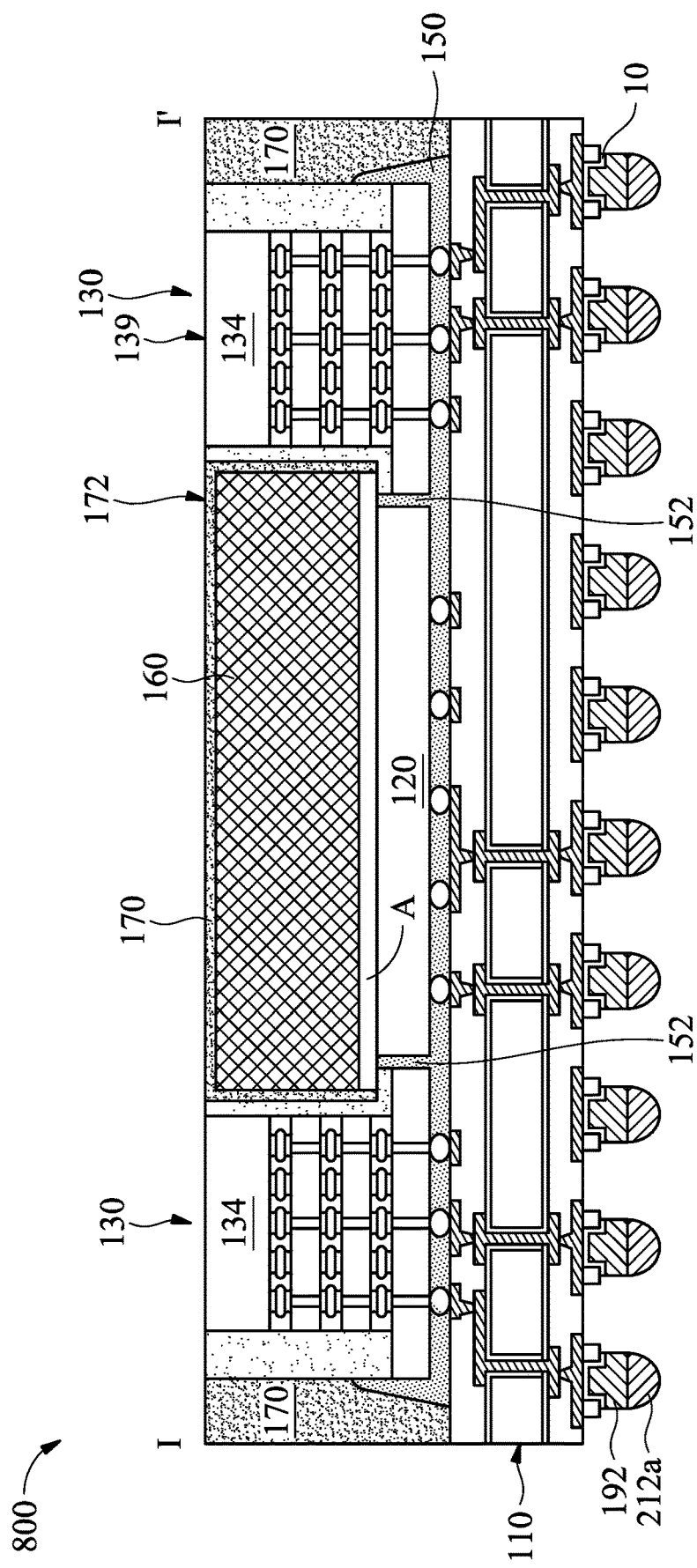
FIG. 8B is a cross-sectional view illustrating the chip package structure along a sectional line I-I' in FIG. 8A, in accordance with some embodiments.

FIG. 8A is a top view of a chip package structure 800, in accordance with some embodiments. FIG. 8B is a cross-sectional view illustrating the chip package structure 800 along a sectional line I-I' in FIG. 8A, in accordance with some embodiments.

As shown in FIGS. 8A and 8B, the chip package structure 800 is similar to the chip package structure 400 of FIG. 4A, except that the width W1 of the anti-warpage bar 160 is greater than the width W6 of the chip structure 120, in accordance with some embodiments. The anti-warpage bar 160 extends across the chip structure 120, in accordance with some embodiments.

Processes and materials for forming the chip package structures 200, 300, 400, 500, 700, and 800 may be similar to, or the same as, those for forming the chip package structure 100 described above.

In accordance with some embodiments, chip package structures and methods for forming the same are provided. The methods (for forming the chip package structure) form an anti-warpage bar in a first chip structure and a second chip structure and extending across a gap between the first chip structure and the second chip structure. The anti-warpage bar reduces the warpage of the chip package structure resulting from the mismatch of coefficients of thermal expansion between the first chip structure and the second chip structure.

In accordance with some embodiments, a chip package structure is provided. The chip package structure includes a substrate. The chip package structure also includes a first chip structure and a second chip structure over the substrate. The chip package structure further includes an anti-warpage bar between the first chip structure and the second chip structure. In addition, the chip package structure includes an underfill layer between the first chip structure and the second chip structure and between the anti-warpage bar and the substrate. A topmost surface of the underfill layer is lower than a top surface of the anti-warpage bar.

In accordance with some embodiments, a chip package structure is provided. The chip package structure includes a substrate. The chip package structure also includes a first chip structure and a second chip structure over the substrate. The first chip structure has a first bottom surface between a first topmost surface and a first bottommost surface of the first chip structure. The second chip structure has a second bottom surface between a second topmost surface and a second bottommost surface of the second chip structure. The chip package structure further includes an anti-warpage bar over the first bottom surface of first chip structure and the second bottom surface of the second chip structure. In addition, the chip package structure includes an adhesive layer between the anti-warpage bar and the first bottom surface of first chip structure and between the anti-warpage bar and the second bottom surface of the second chip structure.

In accordance with some embodiments, a chip package structure is provided. The chip package structure includes a substrate. The chip package structure also includes a first chip structure and a second chip structure over the substrate. The first chip structure includes a plurality of semiconductor dies and a molding layer surrounding the plurality of semiconductor dies. The chip package structure further includes an anti-warpage bar in the first chip structure and in or over the second chip structure. A first width of an upper portion of the molding layer at a first side of the plurality of semiconductor dies adjacent to the anti-warpage bar is less than a second width of the molding layer at second side opposite to the first side of the plurality of semiconductor dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A chip package structure, comprising:
 a substrate;
 a first chip structure and a second chip structure over the substrate;
 an anti-warpage bar between the first chip structure and the second chip structure, wherein the anti-warpage bar is separated from the first chip structure and the second chip structure by an adhesive layer; and
 an underfill layer between the first chip structure and the second chip structure and between the anti-warpage bar and the substrate, wherein a topmost surface of the underfill layer is lower than a top surface of the anti-warpage bar, wherein the underfill layer is in direct contact with a bottom surface of the adhesive layer.

2. The chip package structure as claimed in claim 1, wherein a top surface of the underfill layer directly below the anti-warpage bar is lower than the topmost surface of the underfill layer.

3. The chip package structure as claimed in claim 1, wherein the underfill layer covers a portion of a sidewall of the first chip structure and exposes another portion of the sidewall of the first chip structure.

4. The chip package structure as claimed in claim 1, wherein an end portion of the anti-warpage bar protrudes from a sidewall of the underfill layer.

5. The chip package structure as claimed in claim 1, wherein a length of the anti-warpage bar is greater than a length of the second chip structure in a top view.

6. The chip package structure as claimed in claim 1, wherein the substrate comprises:
   a semiconductor structure;
   an insulating layer over the semiconductor structure; and
   a redistribution structure over the insulating layer.

7. The chip package structure as claimed in claim 6, wherein the substrate further comprises:
   a plurality of conductive vias in the semiconductor structure; and
   a plurality of conductive pads over the redistribution structure and electrically connected to the plurality of conductive vias.

8. The chip package structure as claimed in claim 1, wherein the top surface of the anti-warpage bar is lower than a top surface of the second chip structure.

9. The chip package structure as claimed in claim 1, wherein the top surface of the anti-warpage bar is covered by a molding layer.

10. The chip package structure as claimed in claim 1, wherein a lateral length of the anti-warpage bar is less than a vertical height of the anti-warpage bar.

11. A chip package structure, comprising:
    a substrate;
    a first chip structure and a second chip structure over the substrate, wherein the first chip structure has a first bottom surface between a first topmost surface and a first bottommost surface of the first chip structure, and the second chip structure has a second bottom surface between a second topmost surface and a second bottommost surface of the second chip structure;
    an anti-warpage bar over the first bottom surface of first chip structure and the second bottom surface of the second chip structure; and
    an adhesive layer between the anti-warpage bar and the first bottom surface of first chip structure and between the anti-warpage bar and the second bottom surface of the second chip structure, wherein the adhesive layer is in direct contact with a molding layer of the first chip structure and the second chip structure.

12. The chip package structure as claimed in claim 11, wherein a width of the adhesive layer overlapping the second chip structure is greater than a width of the adhesive layer overlapping the first chip structure.

13. The chip package structure as claimed in claim 11, further comprising:
    an underfill layer surrounding lower portions of the first chip structure and the second chip structure.

14. The chip package structure as claimed in claim 13, wherein the underfill layer is in direct contact with a first sidewall of the first chip structure connecting the first bottom surface of the first chip structure and the first bottommost surface of the first chip structure and a second sidewall of the second chip structure connecting the second bottom surface of the second chip structure and the second bottommost surface of the second chip structure.

15. A chip package structure, comprising:
    a substrate;
    a first chip structure and a second chip structure over the substrate, wherein the first chip structure comprises a plurality of semiconductor dies and a molding layer surrounding the plurality of semiconductor dies; and
    an anti-warpage bar in the first chip structure and in or over the second chip structure, wherein a first width of the molding layer at a first side of the plurality of semiconductor dies adjacent to the anti-warpage bar is less than a second width of the molding layer at second side opposite to the first side of the plurality of semiconductor dies, wherein the molding layer at the first side of the plurality of semiconductor dies includes a horizontal portion and a vertical portion, and a bottom surface of the anti-warpage bar is disposed over a top surface of the horizontal portion of the molding layer.

16. The chip package structure as claimed in claim 15, wherein a lower portion of the molding layer has a third width at the first side of the plurality of semiconductor dies substantially equal to the second width of the molding layer.

17. The chip package structure as claimed in claim 15, wherein a width of the anti-warpage bar overlapping the second chip structure is greater than a width of the anti-warpage bar overlapping the molding layer of the first chip structure.

18. The chip package structure as claimed in claim 15, wherein a top surface of the molding layer of the first chip structure is substantially level with the top surface of the second chip structure.

19. The chip package structure as claimed in claim 15, wherein a top surface of the molding layer of the first chip structure is higher than a top surface of the anti-warpage bar.

20. The chip package structure as claimed in claim 15, wherein a bottom surface of the molding layer of the first chip structure is higher than a bottom surface of the second chip structure.

* * * * *